(12) United States Patent
Yasui et al.

(10) Patent No.: US 9,082,834 B2
(45) Date of Patent: Jul. 14, 2015

(54) NITRIDE SEMICONDUCTOR DEVICE

(71) Applicant: SHARP KABUSHIKI KAISHA, Osaka-shi, Osaka (JP)

(72) Inventors: Tadashi Yasui, Osaka (JP); Satoshi Morishita, Osaka (JP); Koichiro Fujita, Osaka (JP); Daisuke Kurita, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/391,523

(22) PCT Filed: Mar. 21, 2013

(86) PCT No.: PCT/JP2013/058024
§ 371 (c)(1),
(2) Date: Oct. 9, 2014

(87) PCT Pub. No.: WO2013/153927
PCT Pub. Date: Oct. 17, 2013

(65) Prior Publication Data
US 2015/0076562 A1    Mar. 19, 2015

(30) Foreign Application Priority Data

Apr. 11, 2012   (JP) .................................. 2012-090170
Jun. 12, 2012   (JP) .................................. 2012-133008

(51) Int. Cl.
| H01L 29/778 | (2006.01) |
| H01L 29/417 | (2006.01) |
| H01L 29/66 | (2006.01) |
| H01L 29/205 | (2006.01) |

(Continued)

(52) U.S. Cl.
CPC .......... *H01L 29/7787* (2013.01); *H01L 29/205* (2013.01); *H01L 29/41766* (2013.01); *H01L 29/452* (2013.01); *H01L 29/66462* (2013.01);

(Continued)

(58) Field of Classification Search
CPC ............ H01L 29/205; H01L 29/41766; H01L 29/452; H01L 29/66462; H01L 29/7787; H01L 2924/01017
See application file for complete search history.

(56) References Cited

U.S. PATENT DOCUMENTS 6,329,716 B1    12/2001   Nido et al.
6,331,483 B1 *  12/2001   Ishizuka et al. ............... 438/648

(Continued)

FOREIGN PATENT DOCUMENTS

| JP | 2967743 B2 | 10/1999 |
| JP | 2007-053185 A | 3/2007 |
| JP | 2011-155221 A | 8/2011 |

*Primary Examiner* — Eduardo A Rodela
*Assistant Examiner* — Christopher M Roland
(74) *Attorney, Agent, or Firm* — Birch, Stewart, Kolasch & Birch, LLP

(57) ABSTRACT

A nitride semiconductor device is provide that can reduce contact resistance of an ohmic electrode and a nitride semiconductor layer. In a GaN HFET, recesses (106, 109) are formed in a nitride semiconductor multilayer body (20) composed of an undoped GaN layer (1) and an undoped AlGaN layer (2) formed on an Si substrate (10), and a source electrode (11) and a drain electrode (12) are formed in the recesses (106, 109). In a region deeper than an interface (S1, S2) between the GaN layer (1) and the source electrode (11) and drain electrode (12), which are formed from a TiAl material, a first chlorine concentration peak (P11) is formed in vicinity of the interface, and a second chlorine concentration peak (P22) having a chlorine concentration of $1.3 \times 10^{17}$ cm$^{-3}$ or lower is formed at a position deeper than the first chlorine concentration peak (P11).

6 Claims, 17 Drawing Sheets

(51) Int. Cl.
  *H01L 29/45* (2006.01)
  *H01L 29/40* (2006.01)
  *H01L 29/423* (2006.01)
  *H01L 29/20* (2006.01)
(52) U.S. Cl.
  CPC ........... *H01L 29/2003* (2013.01); *H01L 29/402* (2013.01); *H01L 29/42316* (2013.01); *H01L 2924/01017* (2013.01)

(56) References Cited

U.S. PATENT DOCUMENTS

| | | | |
|---|---|---|---|
| 2007/0051978 A1* | 3/2007 | Mita et al. | 257/194 |
| 2010/0068855 A1* | 3/2010 | Saxler et al. | 438/172 |
| 2011/0189826 A1 | 8/2011 | Mita et al. | |
| 2012/0080756 A1* | 4/2012 | Suzuki et al. | 257/369 |

* cited by examiner

NITRIDE SEMICONDUCTOR DEVICE

TECHNICAL FIELD

The present invention relates to a nitride semiconductor device.

BACKGROUND ART

Among conventional nitride semiconductor devices is one fabricated by performing oxygen plasma processing on a surface of an n-type GaN contact layer to form an oxygen-doped layer and thereafter forming an ohmic electrode on the n-type GaN contact layer so that a contact resistance between the n-type GaN contact layer and the ohmic electrode is reduced (see JP 2967743 A (PTL1)).

However, with respect to the above nitride semiconductor device, when the present inventor actually performed experiments to form an ohmic electrode after performing oxygen plasma processing on the GaN layer, the ohmic electrode showed a high contact resistance and sufficiently low contact resistance was by no means able to be obtained.

CITATION LIST

Patent Literature

PTL1: JP 2967743 A

SUMMARY OF INVENTION

Technical Problem

Accordingly, an object of the present invention is to provide a nitride semiconductor device capable of reducing the contact resistance between the nitride semiconductor layer and the ohmic electrode.

Solution to Problem

Through keen examinations as to the contact resistance of the ohmic electrode formed on a nitride semiconductor layer, the present inventor found out for the first time that on condition that in a substrate-side region from an interface between an ohmic electrode formed from a TiAl material and a nitride semiconductor layer, a first chlorine concentration peak is generated in vicinity of the interface and a second chlorine concentration peak is generated at a position deeper than the first chlorine concentration peak, the contact resistance characteristic between the nitride semiconductor layer and the ohmic electrode dramatically varies according to the chlorine concentration of the second chlorine concentration peak.

Further, the inventor also found out by experiments for the first time that while the chlorine concentration of the second chlorine concentration peak on the substrate side from the interface is within a certain range, the contact resistance decreases to a large extent.

Based on the above findings, in a first aspect of the present invention, there is provided a nitride semiconductor device comprising:

a substrate;

a nitride semiconductor multilayer body formed on the substrate and having a heterointerface; and ohmic electrodes which are made from a TiAl material and at least part of which are formed on the nitride semiconductor multilayer body or in the nitride semiconductor multilayer body, wherein the nitride semiconductor multilayer body includes:

a first nitride semiconductor layer formed on the substrate; and a second nitride semiconductor layer formed on the first nitride semiconductor layer to make up a heterointerface in combination with the first nitride semiconductor layer, and wherein a chlorine concentration distribution in a depthwise direction over a range from the ohmic electrodes formed from the TiAl material to the nitride semiconductor multilayer body has:

a first chloride concentration peak at a position in vicinity of an interface between the ohmic electrodes and the nitride semiconductor multilayer body and in a substrate side region from the interface; and a second chloride concentration peak at a position deeper than the first chloride concentration peak, and wherein the chlorine concentration of the second chlorine concentration peak is within a range of $3\times10^{16}$ cm$^{-3}$ to $1.3\times10^{17}$ cm$^{-3}$.

According to the nitride semiconductor device of the first aspect of the invention, in the substrate-side region from the interface between the ohmic electrode formed from the TiAl material and the nitride semiconductor multilayer body, the second chloride concentration peak within the range of $3\times10^{16}$ cm$^{-3}$ to $1.3\times10^{17}$ cm$^{-3}$ is formed at a position deeper than the first chlorine concentration peak in vicinity of the interface. As a result of this, the contact resistance between the nitride semiconductor multilayer body and the ohmic electrode can be reduced to a large extent.

In a nitride semiconductor device of one embodiment, the position of the second chlorine concentration peak is at a depth within a range of 60 nm to 100 nm from the interface.

According to this embodiment, since the second oxygen concentration peak is positioned at a depth within the range of 60 nm to 100 nm from the interface, the contact resistance between the nitride semiconductor multilayer body and the ohmic electrode can be reduced.

Through keen examinations as to the contact resistance of the ohmic electrode formed on a nitride semiconductor layer, the present inventor also found out that in a substrate-side region from the interface between the ohmic electrode formed from a TiAl material and the nitride semiconductor layer, the contact resistance characteristic between the nitride semiconductor layer and the ohmic electrode varies in response to the oxygen concentration of oxygen concentration peak and the chlorine concentration of the chlorine concentration peak generated in vicinity of the interface.

Further, the present inventor found out for the first time that the contact resistance decreases to a large extent under a condition that the oxygen concentration of the oxygen concentration peak and the chlorine concentration of the chlorine concentration peak in substrate-side vicinity from the interface are within certain ranges, respectively.

Based on the above findings, in a second aspect of the invention, there is provided a nitride semiconductor device comprising:

a substrate;

a nitride semiconductor multilayer body formed on the substrate and having a heterointerface; and ohmic electrodes which are made from a TiAl material and at least part of which are formed in the nitride semiconductor multilayer body, wherein the nitride semiconductor multilayer body includes:

a first nitride semiconductor layer formed on the substrate; and a second nitride semiconductor layer formed on the first nitride semiconductor layer to make up a heterointerface in combination with the first nitride semiconductor layer, and wherein an oxygen concentration distribution in a depthwise direction over a range from the ohmic electrodes formed from the TiAl material to the nitride semiconductor multilayer body has an oxygen concentration peak at a position in vicinity of an interface between the ohmic electrodes and the nitride semiconductor multilayer body and in a substrate side region from the interface, where the oxygen concentration of the oxygen concentration peak is within a range of $1.1 \times 10^{18}$ cm$^{-3}$ to $6.8 \times 10^{18}$ cm$^{-3}$, and wherein a chlorine concentration distribution in a depthwise direction over a range from the ohmic electrodes formed from the TiAl material to the nitride semiconductor multilayer body has a chlorine concentration peak at a position in vicinity of the interface between the ohmic electrodes and the nitride semiconductor multilayer body and in a substrate side region from the interface, where the chlorine concentration of the chlorine concentration peak is within a range of $5.0 \times 10^{16}$ cm$^{-3}$ to $9.6 \times 10^{17}$ cm$^{-1}$.

According to the nitride semiconductor device of the second aspect of the invention, in a substrate-side region from the interface between the ohmic electrode formed from the TiAl material and the nitride semiconductor multilayer body, the oxygen concentration of the oxygen concentration peak in vicinity of the interface is within a range of $1.1 \times 10^{18}$ cm$^{-3}$ to $6.8 \times 10^{18}$ cm$^{-3}$ and moreover the chlorine concentration of the chlorine concentration peak in vicinity of the interface is within a range of $5.0 \times 10^{16}$ cm$^{-3}$ to $9.6 \times 10^{17}$ cm$^{-3}$. As a result of this, the contact resistance between the nitride semiconductor multilayer body and the ohmic electrode can be reduced to a large extent.

In a nitride semiconductor device of one embodiment, the nitride semiconductor multilayer body includes:

recesses which extend through the second nitride semiconductor layer and reach a two-dimensional electron gas layer in vicinity of the heterointerface, and wherein at least part of the ohmic electrodes are buried in the recesses.

According to this embodiment, in the nitride semiconductor device of a recess structure, the contact resistance between the two-dimensional electron gas layer in vicinity of the heterointerface and the ohmic electrode can be reduced.

Advantageous Effects of Invention

According to the nitride semiconductor device in the first aspect of the invention, in a substrate-side region from the interface between the ohmic electrode formed from the TiAl material and the nitride semiconductor multilayer body, a second chloride concentration peak having a chlorine concentration of $1.3 \times 10^{17}$ cm$^{-3}$ or lower is formed at a position deeper than the position of the first chlorine concentration peak in vicinity of the interface. Thus, the contact resistance between the nitride semiconductor multilayer body and the ohmic electrode can be reduced to a large extent.

According to the nitride semiconductor device in the second aspect of the invention, in a substrate-side region from the interface between the ohmic electrode formed from the TiAl material and the nitride semiconductor multilayer body, the oxygen concentration of the oxygen concentration peak in vicinity of the interface is within a range of $1.1 \times 10^{18}$ cm$^{-3}$ to $6.8 \times 10^{18}$ cm$^{-3}$ and moreover the chlorine concentration of the chlorine concentration peak in vicinity of the interface is within a range of $5.0 \times 10^{16}$ cm$^{-3}$ to $9.6 \times 10^{17}$ cm$^{-3}$. As a result of this, the contact resistance between the nitride semiconductor multilayer body and the ohmic electrode can be reduced to a large extent.

DESCRIPTION OF EMBODIMENTS

Hereinbelow, the present invention will be described in detail by way of embodiments thereof illustrated in the accompanying drawings.

First Embodiment

Figure 1:
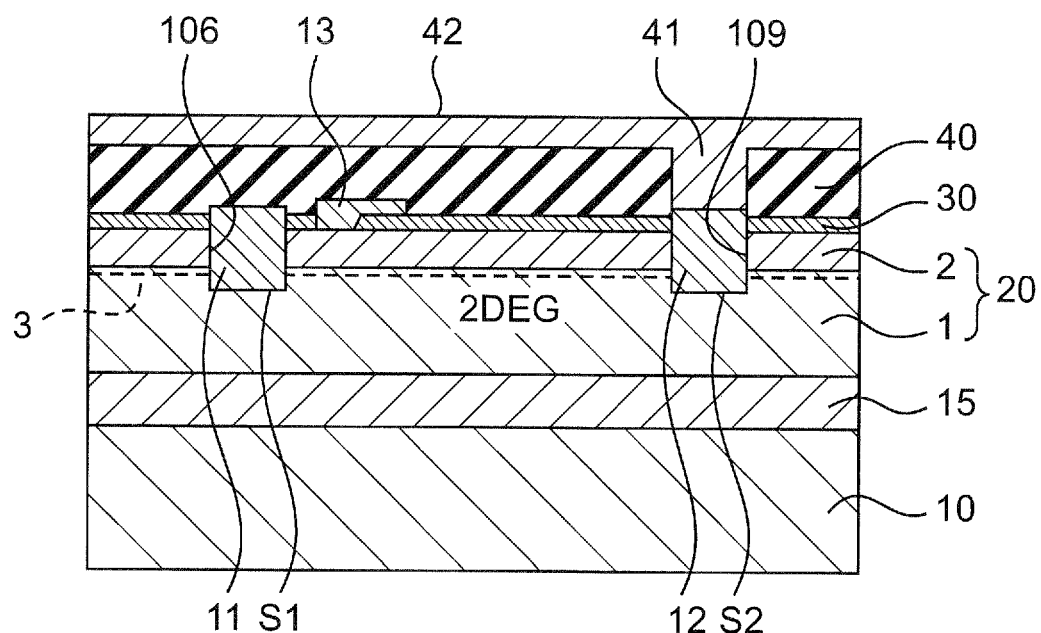
FIG. 1 is a sectional view of a nitride semiconductor device according to a first embodiment of the present invention.

FIG. 1 is a sectional view of a nitride semiconductor device according to a first embodiment of the invention. This nitride semiconductor device is a GaN-based HFET (Hetero-junction Field Effect Transistor).

In this semiconductor device, as shown in FIG. 1, formed on a Si substrate 10 are an undoped AlGaN buffer layer 15 and a nitride semiconductor multilayer body 20 composed of an undoped GaN layer 1 as an example of a first nitride semiconductor layer and an undoped AlGaN layer 2 as an example of a second nitride semiconductor layer. The interface between the undoped GaN layer 1 and the undoped AlGaN layer 2 is a heterointerface. There arises a 2DEG layer (2-Dimensional Electron Gas layer) 3 in vicinity of the interface between the undoped GaN layer 1 and the undoped AlGaN layer 2.

In addition, the GaN layer 1 may be replaced with an AlGaN layer having a composition smaller in band gap than the AlGaN layer 2. Also, an about 1 nm thick layer formed from GaN as an example may be provided as a cap layer on the AlGaN layer 2.

Also, a source electrode 11 and a drain electrode are formed in a recess 106 and a recess 109, respectively, with a distance therebetween so as to extend through the AlGaN layer 2 and the 2DEG layer 3 and reach the GaN layer 1. Also, on the AlGaN layer 2, a gate electrode 13 is formed at a position which is between the source electrode 11 and the drain electrode 12 and which is closer to the source electrode 11. The source electrode 11 and the drain electrode 12 are ohmic electrodes, and the gate electrode 13 is a Schottky electrode. The source electrode 11, the drain electrode 12, the gate electrode 13, and active regions of the GaN layer 1 and the AlGaN layer 2 where the source electrode 11, the drain electrode 12 and the gate electrode 13 are formed constitute an HFET.

It is noted that the term 'active region' refers to a region of the nitride semiconductor multilayer body 20 (GaN layer 1, AlGaN layer 2) in which carriers flow with a voltage applied to the gate electrode 13 placed between the source electrode 11 and the drain electrode 12 on the AlGaN layer 2.

Then, for protection of the AlGaN layer 2, an insulating film 30 made of $SiO_2$ is formed on the AlGaN layer 2 except its regions where the source electrode 11, the drain electrode 12 and the gate electrode 13 are formed. Also, an interlayer insulating film 40 made of polyimide is formed on the Si substrate 10 in which the source electrode 11, the drain electrode 12 and the gate electrode 13 are formed. In FIG. 1, reference sign 41 denotes a via hole as a contact portion (Vertical Interconnect), and 42 denotes a drain electrode pad. In addition, the insulating film may be formed by using SiN, $Al_2O_3$ or the like other than $SiO_2$. In particular, the insulating film is preferably provided in a multilayer film structure composed of a SiN film of decayed stoichiometry on the semiconductor layer surface for collapse suppression and $SiO_2$ or SiN for surface protection. Also, the interlayer insulating film, without being limited to polyimide, may be formed by using such insulating materials as $SiO_2$ film manufactured by p-CVD (plasma CVD), SOG (Spin On Glass) or BPSG (Boron-Phosphorus-Silicate-Glass).

The source electrode 11 and the drain electrode 12 are formed from a TiAl material, for example, Ti/Al/TiN made by stacking layers of Ti, Al and TiN sequentially on the GaN layer 1.

A chlorine concentration distribution of the GaN layer 1 in a depthwise direction from interfaces S1, S2 between the source electrode 11 as well as the drain electrode 12 and the GaN layer 1 toward the substrate 10 side has a first chlorine concentration peak at a position in vicinity of the interfaces S1, S2, where the chlorine concentration of the first chlorine concentration peak is within a range of $1.0 \times 10^{17}$ cm$^{-3}$ to $2.2 \times 10^{17}$ cm$^{-3}$.

It is noted that the term "vicinity of the interfaces S1, S2" refers to a range within about 33 nm from the interfaces S1, S2 toward the deeper side.

The GaN layer 1 has a second chlorine concentration peak at a position deeper than the position of the first chlorine concentration peak in vicinity of the interfaces S1, S2. The chlorine concentration of the second chlorine concentration peak is within a range of $3 \times 10^{16}$ cm$^{-3}$ to $1.3 \times 10^{17}$ cm$^{-3}$. The chlorine concentration of the second chlorine concentration peak is a value lower than the chlorine concentration of the first chlorine concentration peak. The second chlorine concentration peak is at a depth within a range of 60 nm to 100 nm measuring from the interfaces S1, S2 toward the substrate 10 side.

In the nitride semiconductor device constituted as described above, a channel is formed in the two-dimensional electron gas layer (2DEG layer 3 generated at the interface between the GaN layer 1 and the AlGaN layer 2, and this channel is controlled by applying a voltage to the gate electrode 13 so that the HFET having the source electrode 11, the drain electrode 12 and the gate electrode 13 is turned on and off. While a negative voltage is applied to the gate electrode 13, a depletion layer is formed in the GaN layer 1 under the gate electrode 13 so that the HFET is turned off. On the other hand, while the voltage of the gate electrode 13 is zero volts, no depletion layer is present in the GaN layer 1 under the gate electrode 13 so that the HFET is turned on, hence the HFET being a normally-ON type transistor.

According to the HFET as the nitride semiconductor device of this first embodiment, in the substrate 10-side region from the interfaces S1, S2 between the source electrode 11 as well as the drain electrode 12, which are formed from a TiAl material, and the GaN layer 1, a second chlorine concentration peak within a range of $3 \times 10^{16}$ cm$^{-3}$ to $1.3 \times 10^{17}$ cm$^{-3}$ is formed at a position deeper than the position of the first chlorine concentration peak in vicinity of the interfaces S1, S2, and moreover the second chlorine concentration peak is at a depth within a range of 60 nm to 100 nm measuring from the interfaces S1, S2 toward the substrate 10 side. Thus, the contact resistance between the GaN layer 1 and the source electrode 11 as well as the drain electrode 12 can be reduced to a large extent.

Next, a manufacturing method for the nitride semiconductor device will be described with reference to FIGS. 2 to 5. In FIGS. 2 to 5, for an easier seeing of the drawings, neither the Si substrate nor the undoped AlGaN buffer layer is shown while the source electrode and the drain electrode are changed in size or distance.

Figure 2:
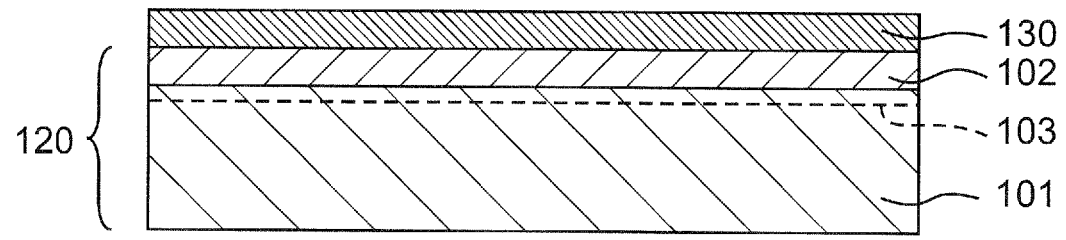
FIG. 2 is a process sectional view for explaining a manufacturing method of the nitride semiconductor device.

First, as shown in FIG. 2, an undoped AlGaN buffer layer (not shown), an undoped GaN layer 101 and an undoped AlGaN layer 102 are formed sequentially on a Si substrate (not shown) by using MOCVD (Metal Organic Chemical Vapor Deposition) process. The undoped GaN layer 101 has a thickness of 1 μm as an example, and the undoped AlGaN layer 102 has a thickness of 30 nm as an example. These GaN layer 101 and AlGaN layer 102 constitute a nitride semiconductor multilayer body 120.

Next, on the AlGaN layer 102, an insulating film 130 (e.g., $SiO_2$) is deposited to a thickness of 200 nm by plasma CVD (Chemical Vapor Deposition) process as an example. In FIG. 2, reference sign 103 denotes a two-dimensional electron gas layer (2DEG layer) formed in vicinity of the heterointerface between the GaN layer 101 and the AlGaN layer 102.

Figure 3:
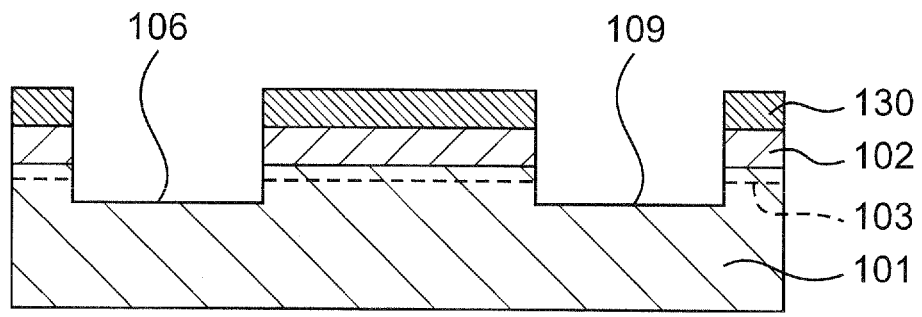
FIG. 3 is a process sectional view subsequent to FIG. 2.

Next, photoresist (not shown) is applied onto the insulating film 130, followed by patterning process. Thereafter, as shown in FIG. 3, portions where the ohmic electrodes are to be formed are removed by dry etching so that recesses 106, 109 are formed in upper portion of the GaN layer 101 so as to extend through the AlGaN layer 102 and be deeper than the 2DEG layer 103. For this dry etching, a chlorine-based gas is used. The recesses 106, 109 may be set to a depth equal to or larger than the depth from the surface of the AlGaN layer 102 to the 2DEG layer 103, being set to, for example, 50 nm.

Also in this first embodiment, the voltage Vdc applied between electrodes in the chamber during the dry etching is set to within a range of 180 V to 240 V.

Next, $O_2$ plasma processing, cleaning by $HCl/H_2O_2$, and cleaning by BHF (Buffered Hydrofluoric acid) or 1% HF (Hydrofluoric acid) are performed in sequence. Then, annealing for reducing etching damage due to the dry etching is performed at, for example, 500 to 850° C.

Figure 4:
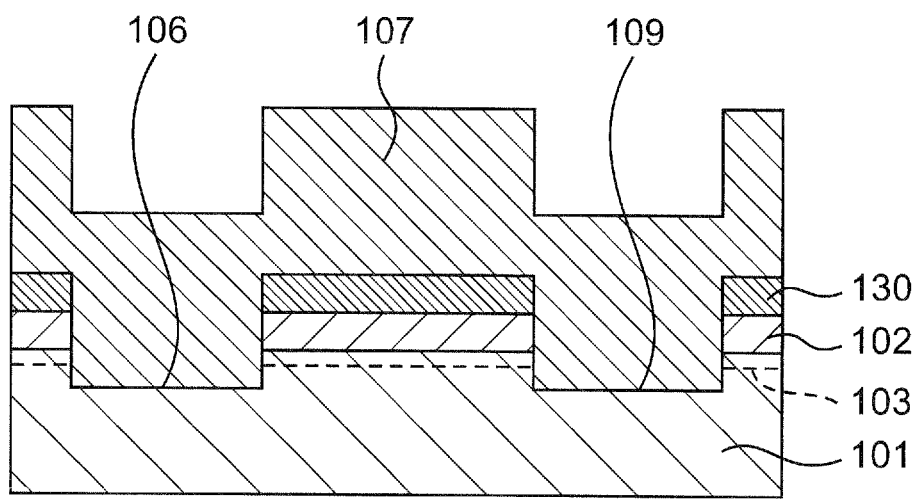
FIG. 4 is a process sectional view subsequent to FIG. 3.

Next, as shown in FIG. 4, on the insulating film 130 and in the recesses 106, 109, Ti, Al, TiN layers are stacked sequentially by sputtering to make up a multilayer of Ti/Al/TiN so that a multilayer metal film 107 to serve as the ohmic electrode is formed. In this case, the TiN layer is a cap layer for protecting the Ti/Al layers from subsequent steps.

In the formation of the multilayer metal film 107 by sputtering, a small quantity (e.g., 5 sccm) of oxygen flow is given into the chamber during deposition of Ti. In this case, the flow rate of oxygen is set such that no oxide of Ti is generated. In addition, instead of giving a small quantity of oxygen flow into the chamber during deposition of Ti, for example, 50 sccm of oxygen flow may be given into the chamber for 5 minutes before the deposition of Ti.

In the above sputtering, both Ti and Al may be sputtered concurrently. Also, instead of sputtering, the Ti and Al may be vapor deposited.

Figure 5:
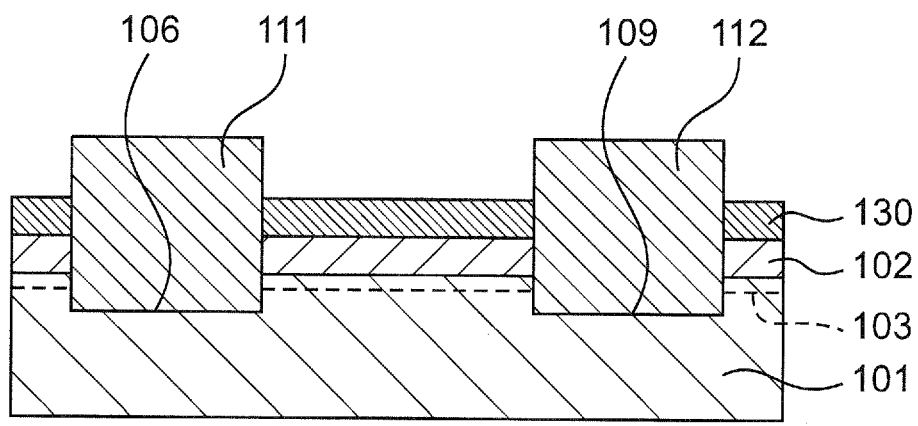
FIG. 5 is a process sectional view subsequent to FIG. 4.

Next, as shown in FIG. 5, patterns of ohmic electrodes 111, 112 are formed by using normal photolithography and dry etching.

Then, the substrate with the ohmic electrodes 111, 112 formed thereon is annealed at temperatures of e.g. 400° C. to 500° C. for 10 minutes or more, by which ohmic contacts can be obtained between the two-dimensional electron gas layer (2DEG layer) 103 and the ohmic electrodes 111, 112. In this case, the contact resistance can be reduced to a large extent, as compared with cases where the annealing is done at high temperatures over 500° C. (e.g., 600° C. or higher). Also, performing the annealing at lower temperatures within the range of 400° C. to 500° C. makes it possible to suppress diffusion of the electrode metal into the insulating film 130 or the like, so that characteristics of the insulating film 130 are never adversely affected. Also, the lower-temperature annealing makes it possible to prevent deterioration of current collapse and characteristic variations due to denitrification from the GaN layer 101. It is noted that the term 'current collapse' refers to a phenomenon that on-resistance of a transistor in high-voltage operation becomes higher relative to on-resistance of the transistor in low-voltage operation.

The ohmic electrodes 111, 112 become the source electrode 11 and the drain electrode 12, and a gate electrode made from TiN or WN or the like is formed between the ohmic electrodes 111, 112 in subsequent process.

Figure 6:
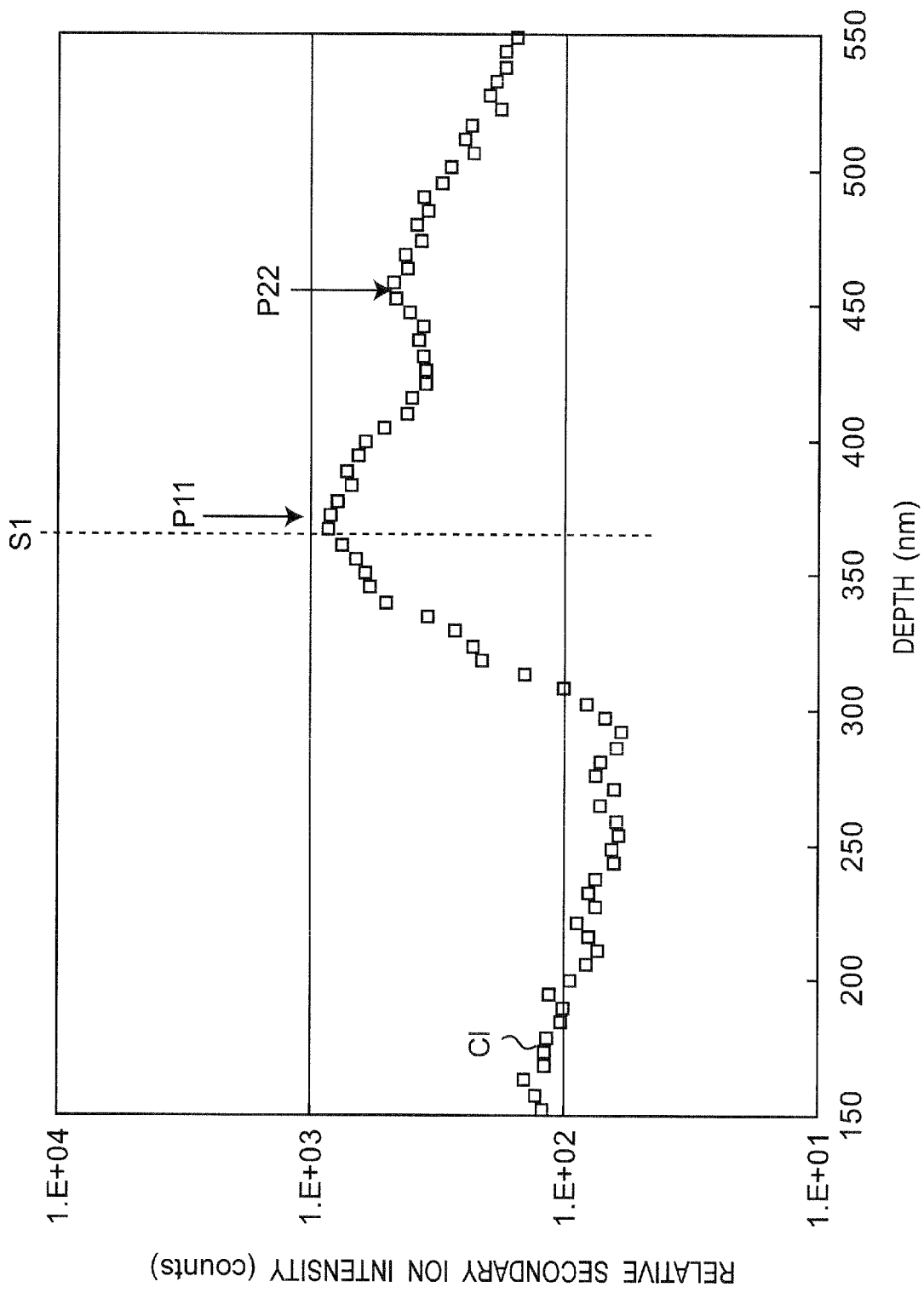
FIG. 6 is a graph showing a chlorine concentration distribution in a depthwise direction over a range from ohmic electrode side to GaN layer side of the interface between the ohmic electrode and the GaN layer in the first embodiment.

According to the manufacturing method for the nitride semiconductor device of the first embodiment, as shown in FIG. 6, in the chlorine concentration distribution in the depthwise direction over the range from the source electrode 11 and the drain electrode 12 as the ohmic electrodes to the GaN layer 1, a first chlorine concentration peak P11 is formed at a position in vicinity of the interfaces S1, S2 (where the term "vicinity of the interfaces S1, S2" refers to a range within about 33 nm toward the deeper side from the interfaces S1, S2) in the undoped GaN layer 1-side region from the interfaces S1, S2 (in FIG. 6, only S1 is shown but S2 is of the same depth) between the source electrode 11, the drain electrode 12 and the undoped GaN layer 1. Also, a second chlorine concentration peak P22 is formed at a position deeper than the first chlorine concentration peak P11. The chlorine concentration of the second chlorine concentration peak P22 can be set to within a range of $2.0 \times 10^{16}$ cm$^{-3}$ to $1.3 \times 10^{17}$ cm$^{-3}$. The chlorine concentration of the first chlorine concentration peak P11 is higher than the chlorine concentration of the second chlorine concentration peak P22, being within a range of $1.0 \times 10^{17}$ cm$^{-3}$ to $2.2 \times 10^{17}$ cm$^{-3}$ as an example.

FIG. 6 is a graph showing an example of the chlorine concentration distribution in the depthwise direction over a range from the source electrode 11 to the undoped GaN layer 1. In FIG. 6, 1.E+01, 1.E+02, . . . , 1.E+04 in the vertical-axis scale represent $1.0 \times 10$, $1.0 \times 10^2$, . . . , $1.0 \times 10^4$, respectively. This graph represents measurement results by SIMS (Secondary Ion Mass Spectrometry) with use of TEG (Test Element Group), where the horizontal axis represents depth (nm) and the vertical axis represents relative secondary ion intensity (counts). In FIG. 6, as an example, the first chlorine concentration peak P11 is positioned at a depth of about 10 nm from the interface S1 toward the GaN layer 1 side, and the second chlorine concentration peak P22 is positioned at a depth of about 95 nm from the interface S1 toward the GaN layer 1 side.

In addition, an oxygen concentration distribution in the depthwise direction over a range from the drain electrode 12 side to the GaN layer 1 side of the interface S2 between the drain electrode 12 and the undoped GaN layer 1 was similar to the graph of FIG. 6. In the example shown in FIG. 6, the chlorine concentration of second chlorine concentration peak P22 was $6 \times 10^{16}$ (cm$^{-3}$), and a contact resistance of 1.1 Ωmm of the ohmic electrodes (source electrode 11, drain electrode 12) was obtained.

As shown in FIG. 6, in order that not only the first chlorine concentration peak P11 but also the second chlorine concentration peak P22 are present, it is necessary that large amounts of damage (immersion of chlorine, introduction of defectives due to ion impact or charge, etc.) be involved on the substrate side during the dry etching. In this connection, the present inventors found out for the first time that a low-resistance ohmic contact can be formed by a chlorine concentration distribution in which such a second chlorine concentration peak P22 as described above is present.

Thus, according to the first embodiment, in a nitride semiconductor device having a recess structure that the ohmic electrodes 111, 112 are partly buried in the recesses 106, 109 which are formed so as to extend through the AlGaN layer 102 and reach the 2DEG layer 3, the contact resistance between the two-dimensional electron gas layer (2DEG layer) 103 and the ohmic electrodes 111, 112 in vicinity of the heterointerface between the GaN layer 101 and the AlGaN layer 102 can be reduced.

Figure 7:
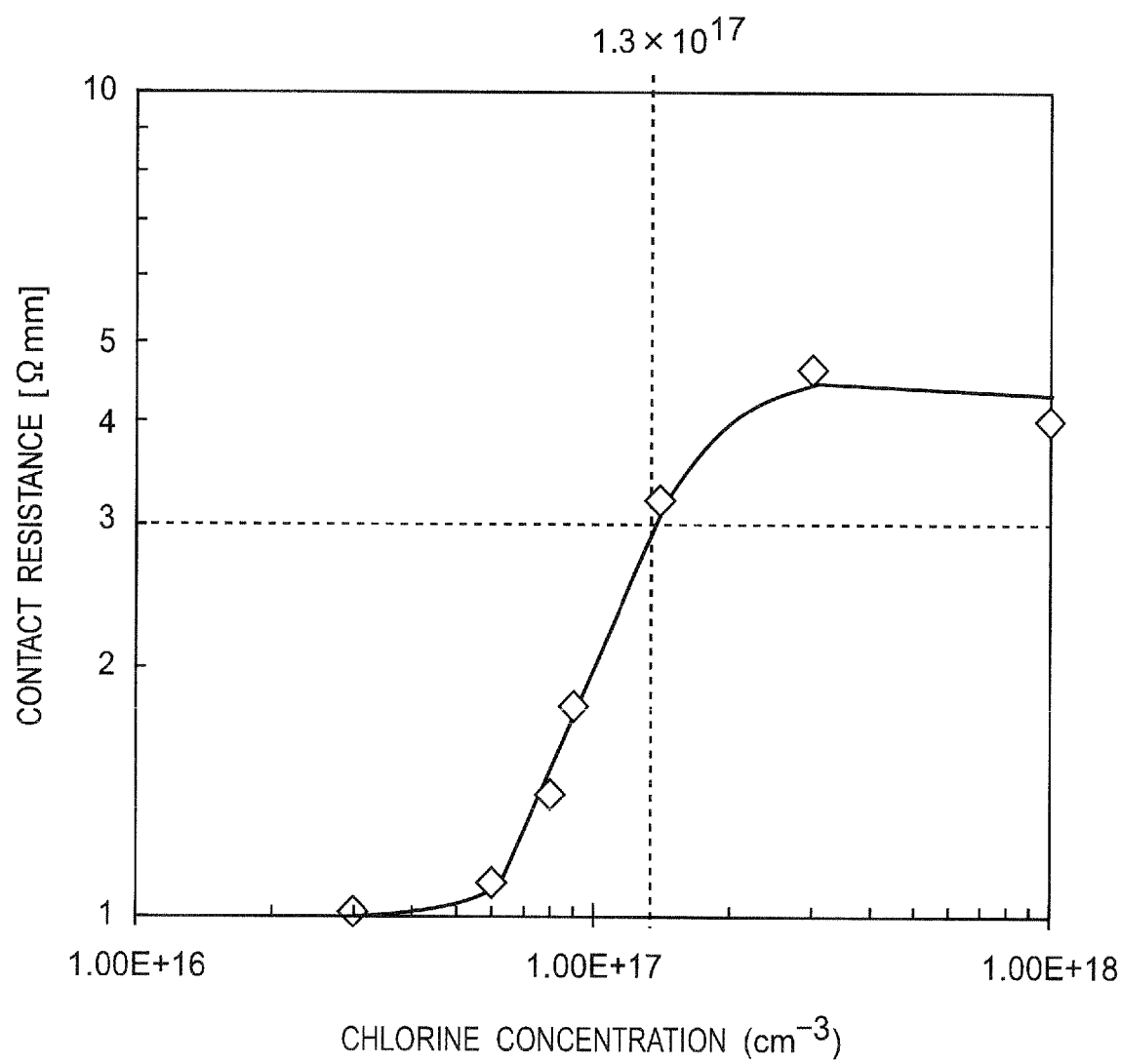
FIG. 7 is a graph showing a relationship between the chlorine concentration (cm$^{-3}$) of the second chlorine concentration peak P22 and the contact resistance of the ohmic electrode in the first embodiment.

Next, FIG. 7 shows a relationship between the chlorine concentration (cm$^{-3}$) of the second chlorine concentration peak P22 and the contact resistance (Ωmm) between the 2DEG layer 3 of the nitride semiconductor multilayer body 20 and the source electrode 11, the drain electrode 12. In FIG. 7, E+16, E+17, E+18 in the horizontal-axis scale represent ×10$^{16}$, ×10$^{17}$, ×10$^{18}$, respectively.

As can be understood from FIG. 7, by the setting that the chlorine concentration (cm$^{-3}$) of the second chlorine concentration peak P22 is not more than $1.3\times10^{17}$ cm$^{-3}$ and not less than $3\times10^{16}$ cm$^{-3}$, the contact resistance (Ωmm) can be set to be not more than 3 (Ωmm). For example, as shown in FIG. 7, when the chlorine concentration (cm$^{-3}$) of the second chlorine concentration peak P22 was set to $6\times10^{16}$ (cm$^{-3}$), a contact resistance (Ωmm) of about 1.1 (Ωmm) was obtained. Also, when the chlorine concentration (cm$^{-3}$) of the second chlorine concentration peak P22 was set to $3\times10^{16}$ (cm$^{-3}$), a contact resistance (Ωmm) of about 1.0 (Ωmm) was obtained. The upper-limit value $1.3\times10^{17}$ cm$^{-3}$ of the chlorine concentration range ($3\times10^{16}$ cm$^{-3}$ to $1.3\times10^{17}$ cm$^{-3}$) of the second chlorine concentration peak P22 has a critical significance because the contact resistance abruptly decreases across a borderline of the value ($1.3\times10^{17}$ cm$^{-3}$) as can be understood from FIG. 7.

On the other hand, as in a case where a fluorine-based gas is used in the dry etching instead of the chlorine-based gas, when the chlorine concentration of the second chlorine concentration peak P22 is zero, no ohmic contact is formed. The reason of this can be considered that when the chlorine concentration of the second chlorine concentration peak P22 is zero, resulting damage (immersion of chlorine, introduction of defectives due to ion impact or charge, etc.) given to the substrate side in the dry etching is insufficient so that a low-resistance ohmic contact is not formed. The lower-limit value $3\times10^{16}$ cm$^{-3}$ of the chlorine concentration range ($3\times10^{16}$ cm$^{-3}$ to $1.3\times10^{17}$ cm$^{-3}$) of the second chlorine concentration peak P22 is such a lower-limit value of chlorine concentration that the ohmic contact is formed without fail.

Also, as the chlorine concentration of the second chlorine concentration peak P22 is over $1.3\times10^{17}$ cm$^{-3}$, the contact resistance goes over 3 Ωmm. The reason of this can be considered that given an excessively high chlorine concentration of the second chlorine concentration peak P22, excess chlorine reacts with Ga and Ti so that N pulling-out reaction from GaN by Ti and oxygen activation, which are reactions on the GaN layer 1 side necessary for ohmic contact formation, are inhibited.

That is, according to this first embodiment, it can be considered that setting the chlorine concentration of the second chlorine concentration peak P22 to within the range of $3.0\times10^{16}$ cm$^{-3}$ to $1.3\times10^{17}$ cm$^{-3}$ made it possible to accelerate the oxygen activation as well as the N pulling-out reaction from GaN, which are GaN layer-side reactions necessary for ohmic contact formation, so that a low-resistance ohmic contact of 3 Ωmm or lower was able to be obtained. A nitride semiconductor device having a contact resistance of 3 Ωmm or lower as shown above has a commercial value in terms of performance and cost as a product capable of being driven with larger current than those for silicon devices and suitable for high-temperature operations.

Furthermore, with a fluorine-based gas used instead of the chlorine-based gas in the dry etching, such a low-resistance ohmic contact as with use of the chlorine-based gas was not formed. Therefore, it can be considered that not only physical damage to the GaN layer in the dry etching but also the presence of chlorine in the dry etching contribute to the formation of a low-resistance ohmic contact.

Figure 10:
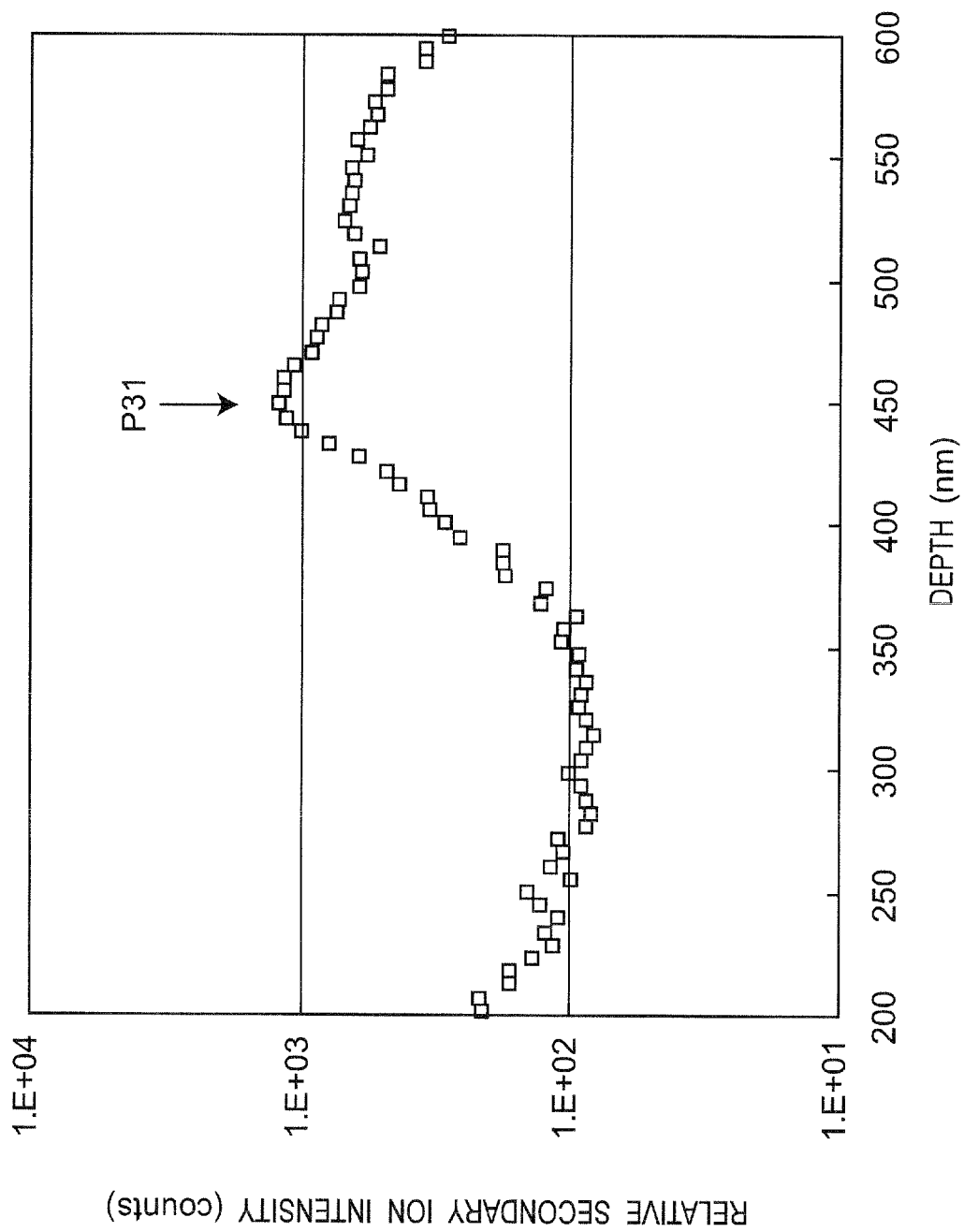
FIG. 10 is a graph showing a chlorine concentration distribution in a depthwise direction over a range from ohmic electrode side to GaN layer side of the interface between an ohmic electrode and a GaN layer in a comparative example.

FIG. 10 is a graph showing a chlorine concentration distribution in the depthwise direction over a range from the ohmic electrodes (source electrode, drain electrode) to the undoped GaN layer in a comparative example of the nitride semiconductor device (GaN-based HFET) of the first embodiment. In FIG. 10, 1.E+01, 1.E+02, 1.E+03, 1.E+04 in the vertical-axis scale represent $1.0\times10$, $1.0\times10^{2}$, $1.0\times10^{3}$, $1.0\times10^{4}$, respectively. The cross-sectional structure of this comparative example is similar to the cross-sectional structure of the first embodiment shown in FIG. 1, but differs from the first embodiment in the chlorine concentration distribution shown in the graph.

The graph of FIG. 10 represents measurement results by SIMS (Secondary Ion Mass Spectrometry) with use of TEG (Test Element Group), where the horizontal axis represents depth (nm) and the vertical axis represents relative secondary ion intensity (counts). As shown in FIG. 10, in this comparative example, a first chlorine concentration peak P31 is present in vicinity of the interface, but no second chlorine concentration peak is present at a position on the GaN layer side deeper than the first chlorine concentration peak P31. As in this comparative example, without the presence of any second chloride concentration peak, the contact resistance of the ohmic electrodes is more than 70 Ωmm, showing a substantial increase as much as about 23-fold of the contact resistance, 3 Ωmm, of the ohmic electrodes of the first embodiment, with the result that no low-resistance ohmic contact was able to be obtained.

Next, in the dry etching for formation of the recesses 106, 109, a relationship between the self-bias voltage Vdc of an RIE (Reactive Ion Etching) device and the contact resistance (Ωmm) of the source electrode 11 and the drain electrode 12 will be explained with reference to FIG. 9. As can be understood from FIG. 9, with the self-bias voltage Vdc for dry etching set to within a range of 180V to 240V, the second chlorine concentration peak P22 is formed and the contact resistance (Ωmm) between the 2DEG layer 3 of the nitride semiconductor multilayer body 20 and the source electrode 11 as well as the drain electrode 12 can be made to be not more than 2 Ωmm.

Figure 9:
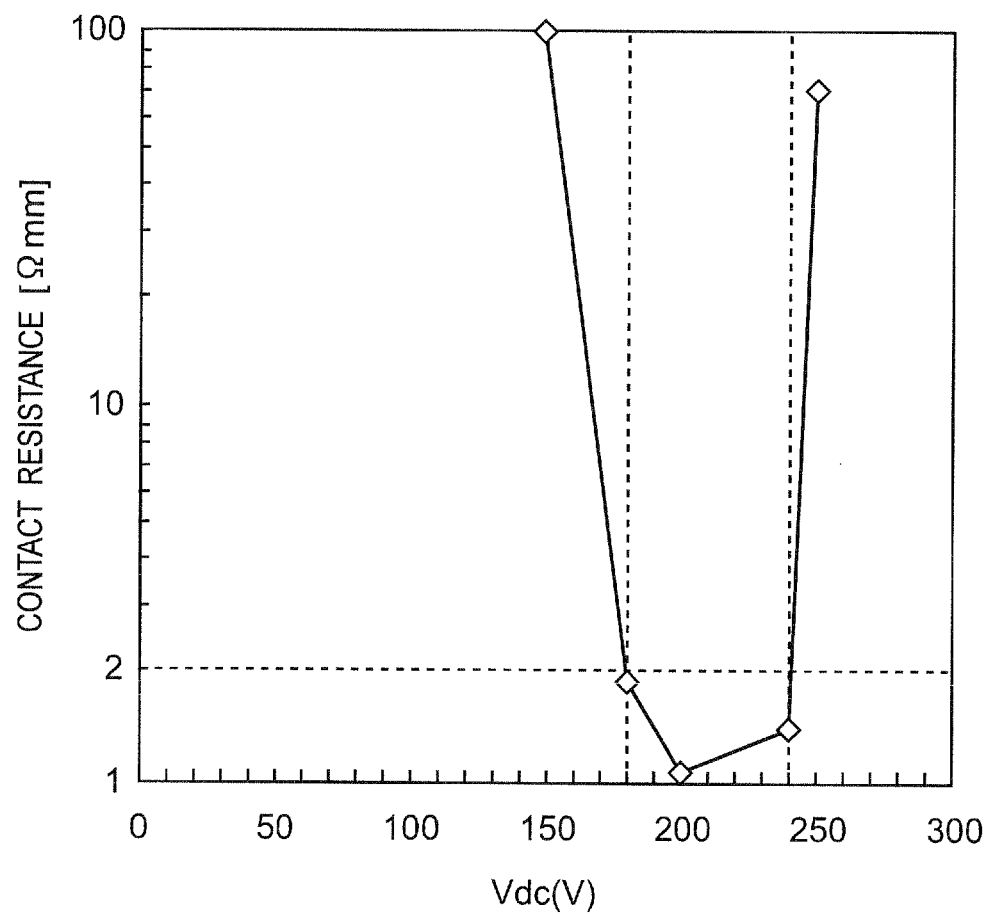
FIG. 9 is a graph showing a relationship between a self-bias voltage Vdc in dry etching of the manufacturing process of the first embodiment and the contact resistance of the ohmic electrode.

On the other hand, as can be understood from FIG. 9, with the self-bias voltage Vdc in the dry etching lower than 180 V, the second chloride concentration peak is less likely to be formed while the contact resistance (Ωmm) rapidly increases. The reason of this can be considered that less damage is given to the GaN layer in the dry etching with the self-bias voltage Vdc in the dry etching excessively small, so that alloying of the electrodes and the GaN layer in the annealing process is less likely to progress.

Also, with the self-bias voltage Vdc over 240 V, the second chloride concentration peak is less likely to be formed while the contact resistance (Ωmm) rapidly increases. The reason of this can be considered that an excessively large self-bias voltage Vdc in the dry etching causes damage to penetrate excessively deep into the GaN layer 1 side so that the alloying of the electrodes and the GaN layer is less likely to progress in the annealing process.

Next, a relationship between the depth (nm) of the second chlorine concentration peak P22 from the interface S1 and the contact resistance (Ωmm) of the source electrode 11 and the drain electrode 12 will be explained with reference to FIG. 8. As can be understood from FIG. 8, on condition that the depth (nm) of the second chlorine concentration peak P22 from the interface S1 is within a range of 60 nm to 100 nm, the contact resistance (Ωmm) can be made to be 2 Ωmm or lower. On condition that the depth (nm) of the second chlorine concentration peak P22 from the interface S1 is less than 60 nm, it becomes unclear to distinguish between the first chlorine concentration peak P11 and the second chlorine concentration peak P22. Also, on condition that the depth (nm) of the second chlorine concentration peak P22 from the interface S1 is more than 100 nm, the second chlorine concentration peak P22 is hardly formed. Therefore, the lower-limit value, 60 nm, of the depth range (60 nm to 100 nm) of the second chlorine concentration peak P22 from the interfaces S1, S2, as well as its upper-limit value, 100 nm, are numerical values having critical significance for formation of the second chlorine concentration peak P22.

Figure 8:
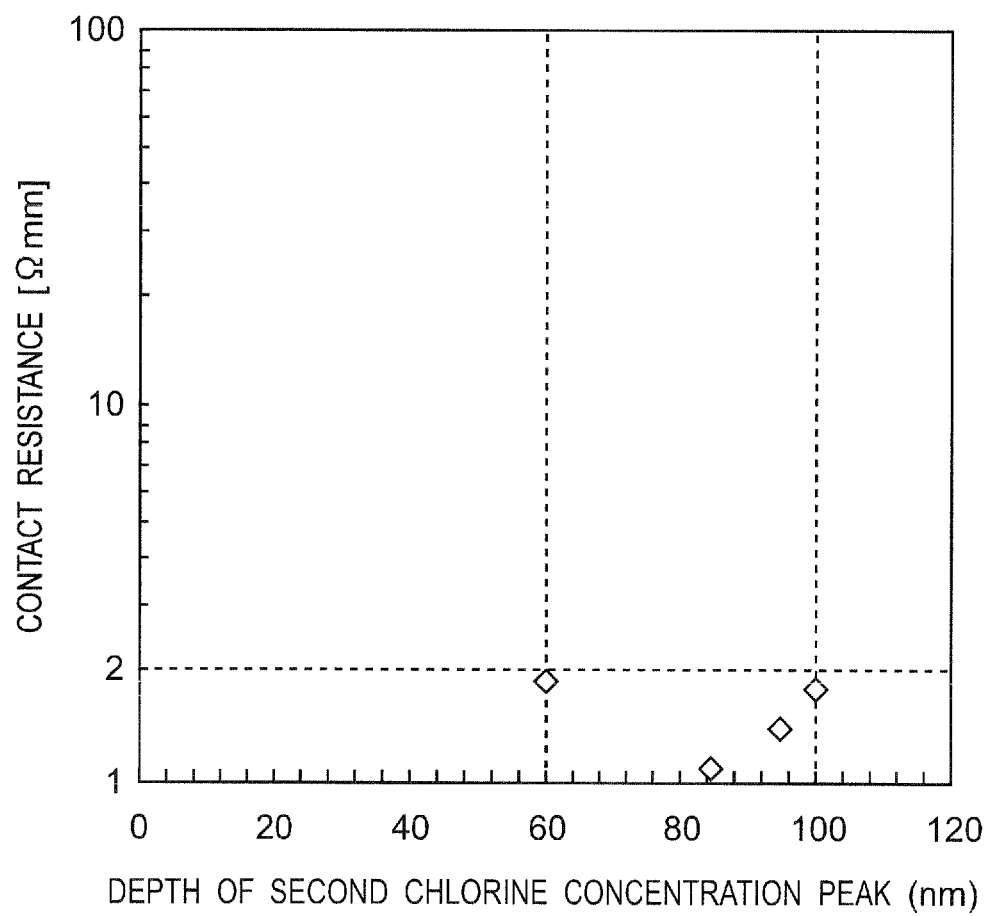
FIG. 8 is a graph showing a relationship between the depth of the second chlorine concentration peak P22 and the contact resistance of the ohmic electrode in the first embodiment.

As shown in FIG. 8, by the constitution that the depth of the second chlorine concentration peak P22 from the interface S1 is within the range of 60 nm to 100 nm, it can be considered that the depth at which reaction (oxygen activation, N pulling-out by Ti, etc.) necessary for formation of the ohmic contact on the substrate side in the low-temperature (400° C. to 500° C.) ohmic annealing process is optimized, so that the ohmic formation reaction is accelerated.

According to the above-described manufacturing method of the first embodiment, the chlorine concentration of the second chlorine concentration peak P22 can be set to a value within the range of $3.0 \times 10^{16}$ cm$^{-3}$ to $1.3 \times 10^{17}$ cm$^{-3}$, and moreover the depth (nm) of the second chlorine concentration peak P22 from the interface S1 can be set to a depth within the range of 60 nm to 100 nm (e.g., 108 nm) and the contact resistance (Ωmm) can be set to 2 Ωmm or lower.

In addition, according to the manufacturing method for the nitride semiconductor device of the first embodiment, the recesses 106, 109 are formed by removing the insulating film 130, the AlGaN layer 102 and the GaN layer 101 by dry etching. Alternatively, the recesses 106, 109 may also be formed by removing the insulating film 130 by wet etching and thereafter removing the AlGaN layer 102 and the GaN layer 101 by dry etching.

Also, according to the manufacturing method for the nitride semiconductor device of the first embodiment, Ti/Al/TiN are multilayered to make up the ohmic electrode. However, this is not limitative. TiN may be omitted, and after Ti/Al is multilayered, Au, Ag, Pt and the like may be stacked in layers thereon.

Also, the first embodiment has been described on a nitride semiconductor device using a Si substrate. However, without being limited to the Si substrate, it is also allowable to use a sapphire substrate or SiC substrate, where nitride semiconductor layers may be grown on the sapphire substrate or SiC substrate, or a nitride semiconductor layer may be grown on a substrate formed from a nitride semiconductor such as growing an AlGaN layer on a GaN substrate. Furthermore, a buffer layer may be formed between the substrate and the nitride semiconductor layer, or a hetero-improvement layer may be formed between the first nitride semiconductor layer and the second nitride semiconductor layer of the nitride semiconductor multilayer body.

Also, the first embodiment has been described on an HFET of a recess structure that the ohmic electrode reaches the GaN layer. However, the invention may also be applied to HFETs in which ohmic electrodes serving as a source electrode and a drain electrode are formed on an undoped AlGaN layer without forming any recess. Further, the nitride semiconductor device of the invention is not limited to HFETs using 2DEG and may be applied also to field effect transistors of other structures, in which case also similar effects can be obtained.

The first embodiment has been described on an HFET of the normally-ON type. Instead, the invention may also be applied to nitride semiconductor devices of the normally-OFF type. Further, without being limited to Schottky electrodes, the invention may also be applied to field effect transistors of the insulated-gate structure. Further, without being limited to field effect transistors, the invention may also be applied to ohmic electrodes of the Schottky diode.

Second Embodiment

Figure 11:
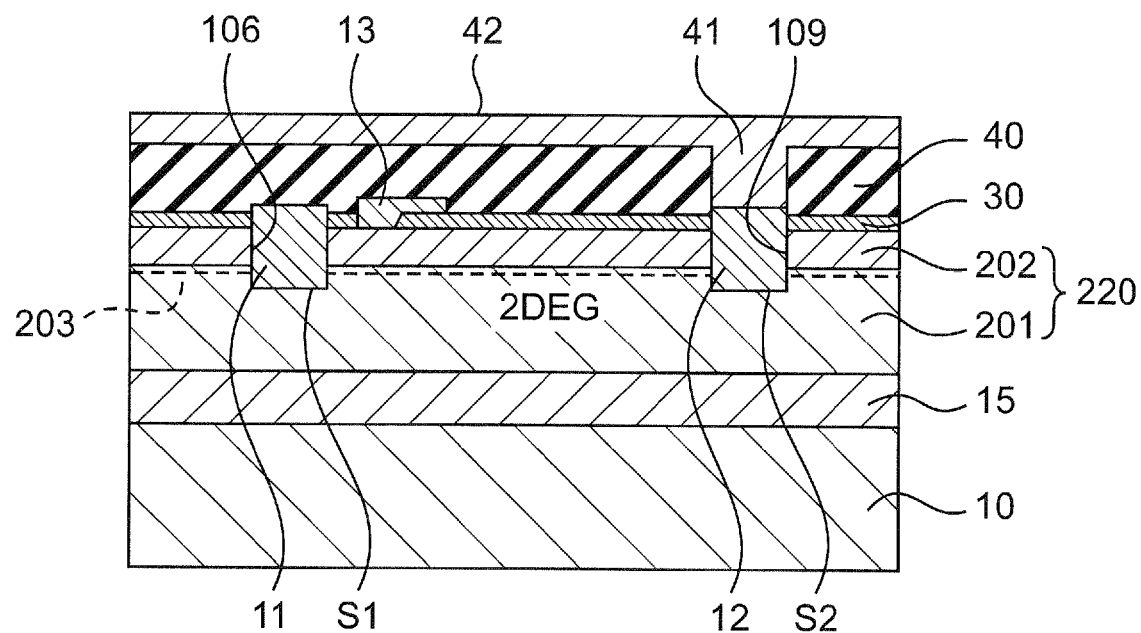
FIG. 11 is a sectional view of a nitride semiconductor device according to a second embodiment of the invention.

FIG. 11 is a sectional view of a nitride semiconductor device according to a second embodiment of the invention. This nitride semiconductor device is a GaN-based HFET (Hetero-junction Field Effect Transistor).

In the description of the nitride semiconductor device according to the second embodiment, the same constituent members as those of the nitride semiconductor device of the first embodiment are designated by the same reference signs as those of the constituent members of the first embodiment, and their description will be given in brief and not in detail.

In this semiconductor device, as shown in FIG. 11, an undoped AlGaN buffer layer 15 and a nitride semiconductor multilayer body 220 composed of an undoped GaN layer 201 as an example of a first nitride semiconductor layer and an undoped AlGaN layer 202 as an example of a second nitride semiconductor layer are formed on a Si substrate 10. An interface between the undoped GaN layer 201 and the undoped AlGaN layer 202 is a heterointerface. A 2DEG layer (two-dimensional electron gas layer) 203 is generated in vicinity of the interface between the undoped GaN layer 201 and the undoped AlGaN layer 202.

In addition, the GaN layer 201 may be replaced with an AlGaN layer having a composition smaller in band gap than the AlGaN layer 202. Also, an about 1 nm thick layer made of GaN as an example may be provided as a cap layer on the AlGaN layer 202.

Also, a source electrode 11 and a drain electrode 12 are formed in a recess 106 and a recess 109, respectively, with a distance therebetween so as to extend through the AlGaN layer 202 and the 2DEG layer 203 and reach the GaN layer 201. Also, on the AlGaN layer 202, a gate electrode 13 is formed at a position which is between the source electrode 11 and the drain electrode 12 and which is closer to the source electrode 11. The source electrode 11 and the drain electrode 12 are ohmic electrodes, and the gate electrode 13 is a Schottky electrode. The source electrode 11, the drain electrode 12, the gate electrode 13, and active regions of the GaN layer 201 and the AlGaN layer 202 where the source electrode 11, the drain electrode 12 and the gate electrode 13 are formed constitute an HFET.

It is noted that the term 'active region' refers to a region of the nitride semiconductor multilayer body 220 (GaN layer 201, AlGaN layer 202) in which carriers flow between the source electrode 11 and the drain electrode 12 with a voltage applied to the gate electrode 13 placed between the source electrode 11 and the drain electrode 12 on the AlGaN layer 202.

Then, for protection of the AlGaN layer 202, an insulating film 30 made of $SiO_2$ is formed on the AlGaN layer 202 except its regions where the source electrode 11, the drain electrode 12 and the gate electrode 13 are formed. Also, an interlayer insulating film 40 made of polyimide is formed on the Si substrate 10 in which the source electrode 11, the drain electrode 12 and the gate electrode 13 are formed. In FIG. 11, reference sign 41 denotes a via hole as a contact portion, and 42 denotes a drain electrode pad. In addition, the insulating film may be given by using SiN, $Al_2O_3$ or the like without being limited to $SiO_2$. In particular, the insulating film is preferably provided in a multilayer film structure composed of a SiN film of decayed stoichiometry on the semiconductor layer surface for collapse suppression and $SiO_2$ or SiN for surface protection. Also, the interlayer insulating film, without being limited to polyimide, may be formed by using such insulating materials as $SiO_2$ film manufactured by p-CVD (plasma CVD), SOG (Spin On Glass) or BPSG (Boron-Phosphorus-Silicate-Glass).

The source electrode 11 and the drain electrode 12 are formed from a TiAl material, for example, Ti/Al/TiN formed by stacking layers of Ti, Al and TiN sequentially on the GaN layer 201.

An oxygen concentration distribution of the GaN layer 201 in the depthwise direction from interfaces S1, S2 between the source electrode 11 as well as the drain electrode 12 and the GaN layer 201 toward the substrate 10 side has a first oxygen concentration peak at a position in vicinity of the interfaces S1, S2, where the oxygen concentration of the first oxygen concentration peak is within a range of $1.1 \times 10^{18}$ $cm^{-3}$ to $6.8 \times 10^{18}$ $cm^{-3}$.

It is noted that the term "vicinity of the interfaces S1, S2" refers to a range within about 33 nm toward the deeper side from the interfaces S1, S2.

The GaN layer 201 has a second oxygen concentration peak at a position deeper than the position of the first oxygen concentration peak in vicinity of the interfaces S1, S2. The oxygen concentration of the second oxygen concentration peak is a value which is about one-order smaller than the oxygen concentration of the first oxygen concentration peak as an example.

Also, the oxygen concentration distribution of the GaN layer 201 in the depthwise direction from the interfaces S1, S2 between the source electrode 11 as well as the drain electrode 12 and the GaN layer 201 toward the substrate 10 side has a first chlorine concentration peak at a position in vicinity (in a range of about 33 nm toward the deeper side from the interfaces S1, S2) of the interfaces S1, S2, where the chlorine concentration of the first chlorine concentration peak is within a range of
$5.0 \times 10^{16}$ $cm^{-3}$ to $9.6 \times 10^{17}$ $cm^{-3}$.

The GaN layer 201 has a second chlorine concentration peak at a position deeper than the position of the first chlorine concentration peak in vicinity of the interfaces S1, S2. The chlorine concentration of the second chlorine concentration peak is a value lower than the chlorine concentration of the first chlorine concentration peak.

In the nitride semiconductor device constituted as described above, a channel is formed in the two-dimensional electron gas layer (2DEG layer) 203 generated in vicinity of the interface between the GaN layer 201 and the AlGaN layer 202, and this channel is controlled by applying a voltage to the gate electrode 13 so that the HFET having the source electrode 11, the drain electrode 12 and the gate electrode 13 is turned on and off. While a negative voltage is applied to the gate electrode 13, a depletion layer is formed in the GaN layer 201 under the gate electrode 13 so that the HFET is turned off. On the other hand, while the voltage of the gate electrode 13 is zero volts, no depletion layer is present in the GaN layer 201 under the gate electrode 13 so that the HFET is turned on, hence the HFET being a normally-ON type transistor.

According to the HFET as the nitride semiconductor device of this second embodiment, in the substrate 10-side region from the interfaces S1, S2 between the source electrode 11 and the drain electrode 12, which are formed from a TiAl material, and the GaN layer 201, the oxygen concentration of the first oxygen concentration peak in vicinity of the interfaces S1, S2 is within the range of $1.1 \times 10^{18}$ $cm^{-3}$ to $6.8 \times 10^{18}$ $cm^{-3}$, and moreover the chlorine concentration of the first chlorine concentration peak in vicinity of the interfaces S1, S2 is within the range of $5.0 \times 10^{16}$ $cm^{-3}$ to $9.6 \times 10^{17}$ $cm^{-3}$. Therefore, the contact resistance between the GaN layer 201 and the source electrode 11 as well as the drain electrode 12 can be reduced to a large extent.

Next, a manufacturing method for the nitride semiconductor device will be described with reference to FIGS. 12 to 15. In FIGS. 12 to 15, for an easier seeing of the drawings, neither the Si substrate nor the undoped AlGaN buffer layer is shown while the source electrode and the drain electrode are changed in size or distance.

Figure 12:
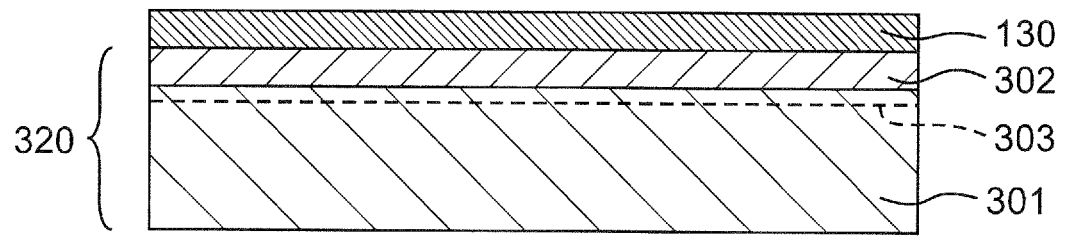
FIG. 12 is a process sectional view for explaining a manufacturing method of the nitride semiconductor device.

First, as shown in FIG. 12, an undoped AlGaN buffer layer (not shown), an undoped GaN layer 301 and an undoped AlGaN layer 302 are formed sequentially on a Si substrate (not shown) by using MOCVD (Metal Organic Chemical Vapor Deposition) process. The undoped GaN layer 301 has a thickness of 1 μm as an example, and the undoped AlGaN layer 302 has a thickness of 30 nm as an example. These GaN layer 301 and AlGaN layer 302 constitute a nitride semiconductor multilayer body 320.

Next, on the AlGaN layer 302, an insulating film 130 (e.g., $SiO_2$) is grown to a thickness of 200 nm by plasma CVD (Chemical Vapor Deposition) process as an example. In FIG. 12, reference sign 303 denotes a two-dimensional electron gas layer (2DEG layer) formed in vicinity of the heterointerface between the GaN layer 301 and the AlGaN layer 302.

Figure 13:
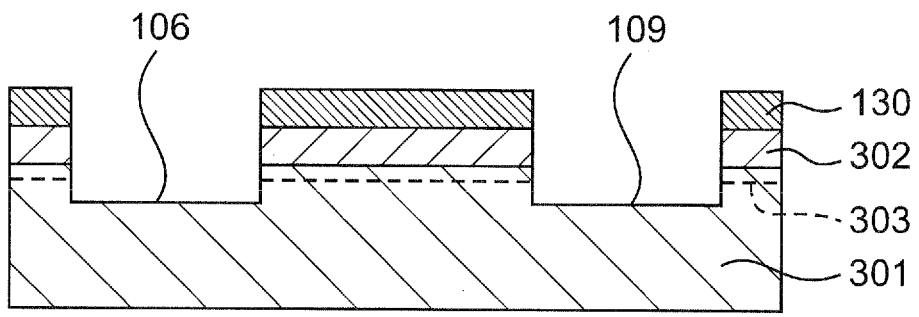
FIG. 13 is a process sectional view subsequent to FIG. 12.

Next, photoresist (not shown) is applied onto the insulating film 130, followed by patterning process. Thereafter, as shown in FIG. 13, portions where the ohmic electrode is to be formed are removed by dry etching so that recesses 106, 109 are formed in upper portion of the GaN layer 301 so as to extend through the AlGaN layer 302 and be deeper than the 2DEG layer 303. For this dry etching, a chlorine-based gas is used. The recesses 106, 109 may be set to a depth equal to or larger than the depth from the surface of the AlGaN layer 302 to the 2DEG layer 303, being set to, for example, 50 nm.

Also in this second embodiment, the self-bias voltage Vdc of the RIE (Reactive Ion Etching) device is set to within a range of 180 V to 240 V in the dry etching.

Next, after peeling of the resist, annealing for reducing etching damage due to the dry etching is performed (at, for example, 500 to 850° C.). Then, $O_2$ plasma processing, cleaning by $HCl/H_2O_2$, and cleaning by BHF (Buffered Hydrofluoric acid) or 1% HF (Hydrofluoric acid) are performed in sequence.

Figure 14:
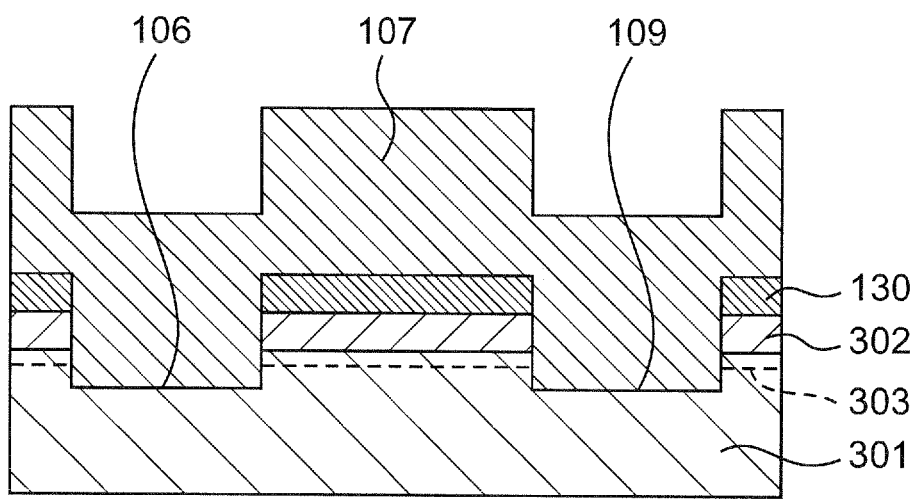
FIG. 14 is a process sectional view subsequent to FIG. 13.

Next, as shown in FIG. 14, on the insulating film 130 and in the recesses 106, 109, Ti, Al, TiN layers are stacked sequentially by sputtering to make up a multilayer of Ti/Al/TiN so that a multilayer metal film 107 to serve as the ohmic electrode is formed. In this case, the TiN layer is a cap layer for protecting the Ti/Al layers from subsequent steps.

In the formation of the multilayer metal film 107 by sputtering, a small quantity (e.g., 5 sccm) of oxygen flow is given into the chamber during deposition of Ti. In this case, the flow rate of the oxygen is set such that no oxide of Ti is generated. In addition, instead of giving a small quantity of oxygen flow into the chamber during deposition of Ti, for example, 50 sccm of oxygen flow may be given into the chamber for 5 minutes before the deposition of Ti.

In the above sputtering, both Ti and Al may be sputtered concurrently. Also, instead of sputtering, the Ti and Al may be vapor deposited.

Figure 15:
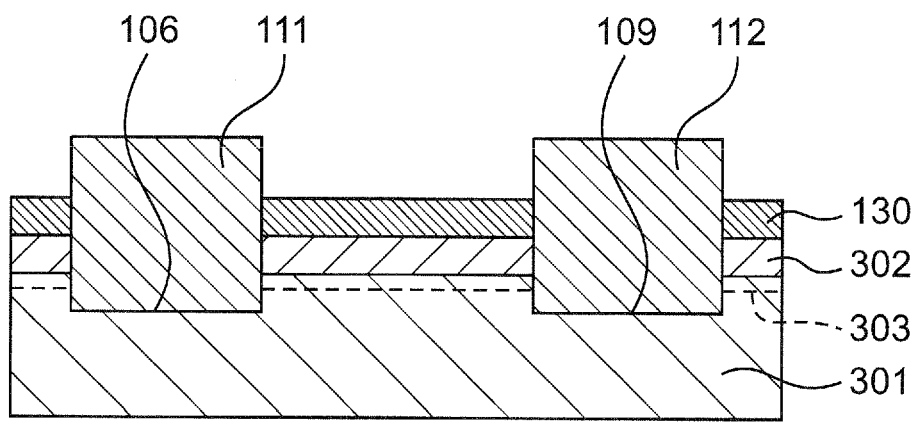
FIG. 15 is a process sectional view subsequent to FIG. 14.

Next, as shown in FIG. 15, patterns of ohmic electrodes 111, 112 are formed by using normal photolithography and dry etching.

Then, the substrate with the ohmic electrodes 111, 112 formed thereon is annealed at temperatures of e.g. 400° C. to 500° C. for 10 minutes or more, by which ohmic contacts can be obtained between the two-dimensional electron gas layer (2DEG layer) 303 and the ohmic electrodes 111, 112. In this case, the contact resistance can be reduced to a large extent, as compared with cases where the annealing is done at high temperatures over 500° C. Also, performing the annealing at lower temperatures within the range of 400° C. to 500° C. makes it possible to suppress diffusion of the electrode metal into the insulating film 130, so that characteristics of the insulating film 130 are never adversely affected. Also, the lower-temperature annealing makes it possible to prevent deterioration of current collapse and characteristic variations due to denitrification from the GaN layer 301. It is noted that the term 'current collapse' refers to a phenomenon that on-resistance of a transistor in high-voltage operation becomes higher relative to on-resistance of the transistor in low-voltage operation.

The ohmic electrodes 111, 112 become the source electrode 11 and the drain electrode 12, and a gate electrode made from TiN or WN or the like is formed between the ohmic electrodes 111, 112 in subsequent process.

Figure 16:
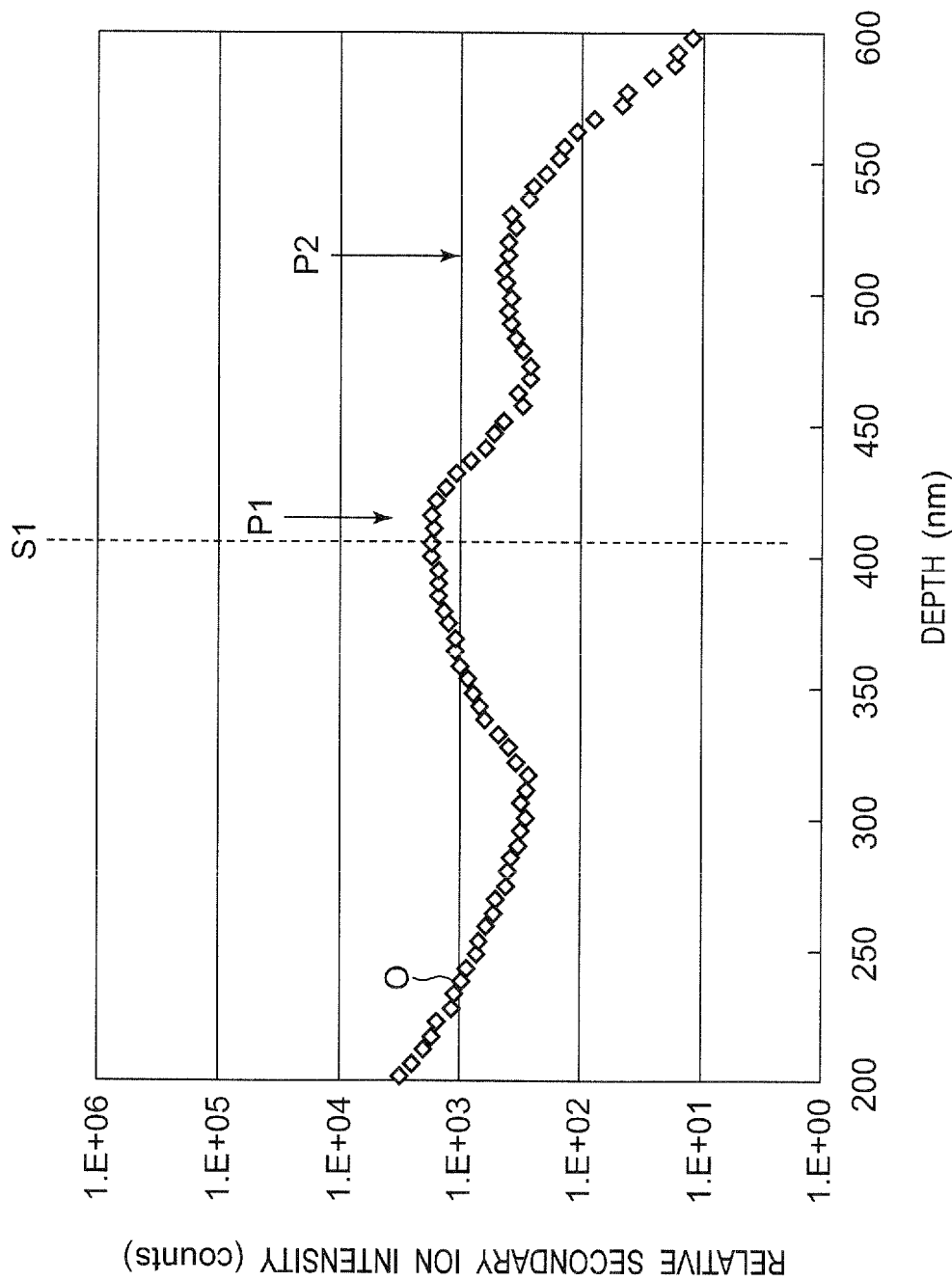
FIG. 16 is a graph showing an oxygen concentration distribution in a depthwise direction over a range from ohmic electrode side to GaN layer side of the interface between the ohmic electrode and the GaN layer.

According to the manufacturing method for the nitride semiconductor device of the second embodiment, as shown in FIG. 16, in the oxygen concentration distribution in the depthwise direction over the range from the source electrode 11 and the drain electrode 12 as the ohmic electrodes to the GaN layer 201, a first oxygen concentration peak P1 is formed at a position in vicinity of the interfaces S1, S2 in the undoped GaN layer 201-side region from the interfaces S1, S2 (in FIG. 16, only S1 is shown but S2 is of the same depth as S1) between the source electrode 11 as well as the drain electrode 12 and the GaN layer 201. Also, a second oxygen concentration peak P2 is formed at a position deeper than the first oxygen concentration peak P1. In addition, the term "vicinity of the interfaces S1, S2," as described later with reference to FIG. 17, refers to, for example, a range of about 33 nm toward the deeper side from the interfaces S1, S2. As can be understood from FIG. 16, the second oxygen concentration peak P2 is positioned deeper than the vicinity of the interfaces.

Also, by the above-described manufacturing method, the oxygen concentration of the first oxygen concentration peak can be set to within a range of, for example, $1.1 \times 10^{18}$ cm$^{-3}$ to $6.8 \times 10^{18}$ cm$^{-3}$. The oxygen concentration of the first oxygen concentration peak is higher than the oxygen concentration of the second oxygen concentration peak.

FIG. 16 is a graph showing an example of the oxygen concentration distribution in the depthwise direction over a range from the source electrode 11 side to the GaN layer 201 side across the interface S1 between the source electrode 11 and the undoped GaN layer 201. In FIG. 16, 1.E+00, 1.E+01, . . . , 1.E+06 in the vertical-axis scale represent 1.0, $1.0 \times 10$, . . . , $1.0 \times 10^6$, respectively. This graph represents measurement results by SIMS (Secondary Ion Mass Spectrometry) with use of TEG (Test Element Group), where the horizontal axis represents depth (nm) and the vertical axis represents relative secondary ion intensity (counts). As shown in FIG. 16, a convex-shaped oxygen concentration distribution is formed at the S1 position. As an example, the first oxygen concentration peak P1 is positioned at an interface-vicinal depth of about 8 nm from the interface S1 toward the GaN layer 201 side, and the second oxygen concentration peak P2 is positioned at a depth of about 108 nm from the interface S1 toward the GaN layer 201 side. In the example of FIG. 16, the oxygen concentration of the first oxygen concentration peak P1 is $2.6 \times 10^{18}$ cm$^{-3}$ and the oxygen concentration of the second oxygen concentration peak P2 is $6.4 \times 10^{17}$ cm$^{-3}$.

In addition, the interface S1 corresponds to a peak position of the relative secondary ion intensity (counts) of carbon C. Also, an oxygen concentration distribution in the depthwise direction over a range from the drain electrode 12 side to the GaN layer 201 side of the interface S2 between the drain electrode 12 and the undoped GaN layer 201 was the same as in the graph of FIG. 16.

Figure 17:
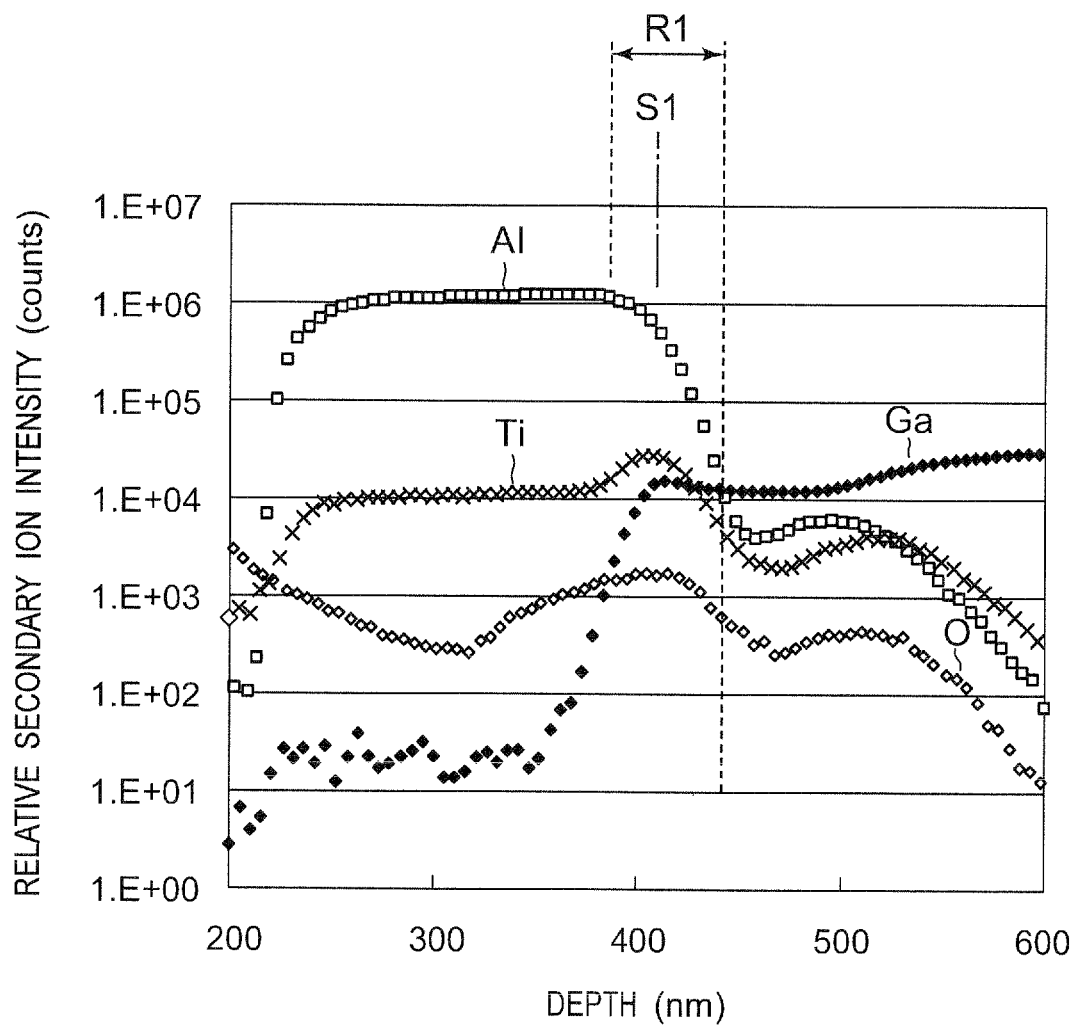
FIG. 17 is a graph showing oxygen, Al, Ti and Ga concentration distributions in a depthwise direction over a range from ohmic electrode side to GaN layer side of the interface between the ohmic electrode and the GaN layer.

FIG. 17 is a graph showing an oxygen concentration distribution as well as Al, Ti and Ga concentration distributions in the depthwise direction over a range from the source electrode side to the GaN layer 201 side across the interface S1 between the source electrode 11 and the undoped GaN layer 201. In FIG. 17, 1.E+00, 1.E+01, . . . , 1.E+07 in the vertical-axis scale represent 1.0, $1.0 \times 10$, . . . , $1.0 \times 10^7$, respectively. This graph as in FIG. 16 represents measurement results by SIMS (Secondary Inn Mass Spectrometry) with use of TEG (Test Element Group), where the horizontal axis represents depth (nm) and the vertical axis represents relative secondary ion intensity (counts). The interface S1 corresponds to a peak position of the relative secondary ion intensity (counts) of carbon C. In the graph of FIG. 17, as an example, an interface-vicinal region R1 is a region ranging from a depth of about 378 nm to a depth of about 438 nm, where the interface-vicinal region R1 corresponds to a range extending to about 27 nm toward the shallower side from the interface S1 and also extending to about 33 nm toward the deeper side from the interface S1.

In addition, concentration distributions of Al, Ti and Gas in the depthwise direction over a range from the drain electrode 12 side to the GaN layer 201 side of the interface S2 between the drain electrode 12 and the undoped GaN layer 201 were the same as in the graph of FIG. 17.

Also, according to the above-described manufacturing method for the nitride semiconductor device of the second embodiment, in the chlorine concentration distribution in the depthwise direction over the range from the source electrode 11 and the drain electrode 12 as the ohmic electrodes to the GaN layer 201, a first chlorine concentration peak P10 is formed at a position in vicinity of the interfaces S1, S2 in the undoped GaN layer 201-side region from the interfaces S1, S2 between the source electrode 11 as well as the drain electrode 12 and the undoped GaN layer 201. Also, a second chlorine concentration peak P20 is formed at a position deeper than the first chlorine concentration peak P10. In addition, the term "vicinity of the interfaces S1, S2," as described before with reference to FIG. 17, refers to, for example, a range of about 33 nm toward the deeper side from the interfaces S1, S2. As can be understood from FIG. 18, the second chlorine concentration peak P20 is positioned deeper than the vicinity of the interfaces.

Also, the chlorine concentration of the first chlorine concentration peak P10 is within a range of, for example, $5.0 \times 10^{16}$ cm$^{-3}$ to $9.6 \times 10^{17}$ cm$^{-3}$. The chlorine concentration of this first chlorine concentration peak P10 is higher than the chlorine concentration of the second chlorine concentration peak P20.

Figure 18:
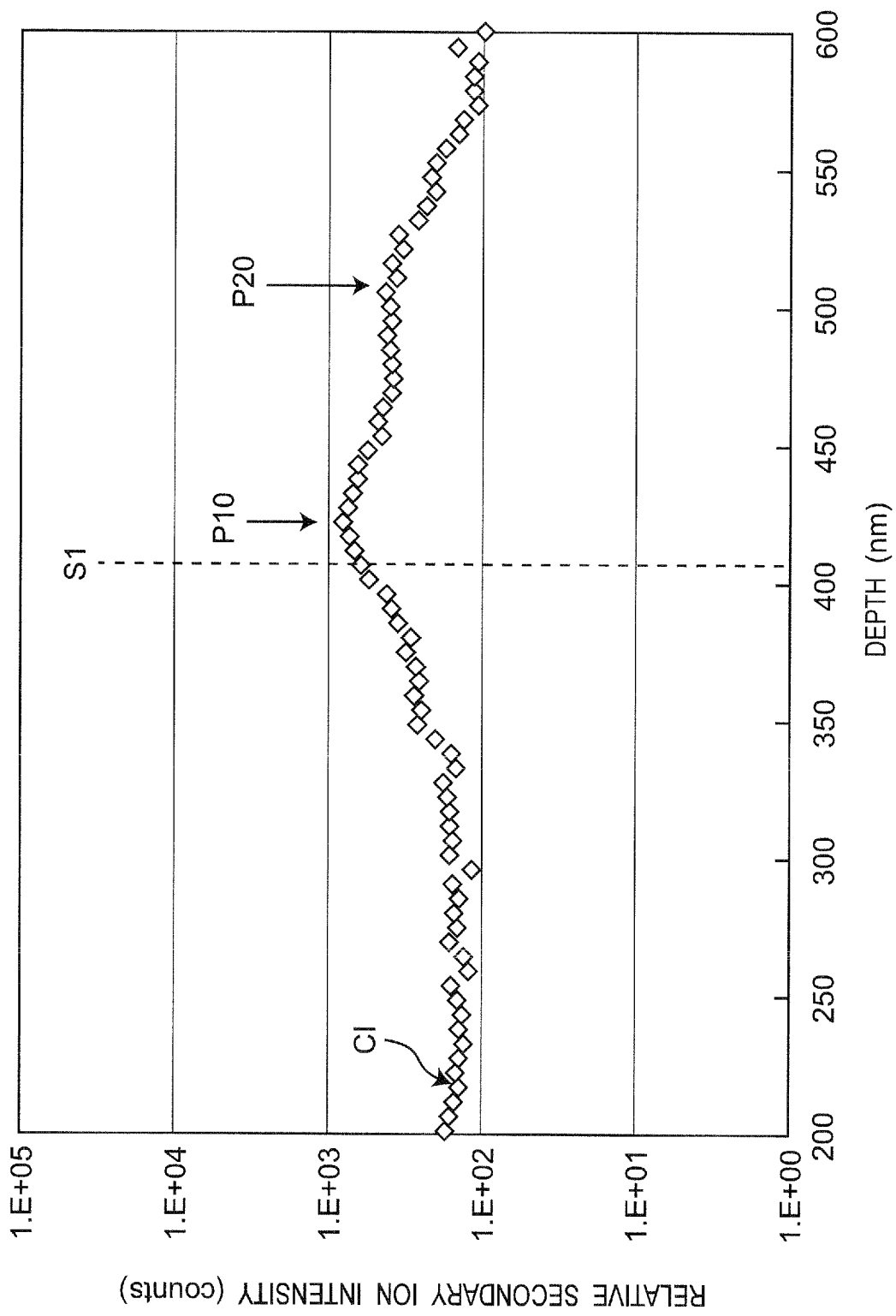
FIG. 18 is a graph showing a chlorine concentration distribution in a depthwise direction over a range from ohmic electrode side to GaN layer side of the interface between the ohmic electrode and the GaN layer in the second embodiment.

FIG. 18 is a graph showing an example of the chlorine concentration distribution in the depthwise direction over a range from the source electrode 11 to the undoped GaN layer

201. In FIG. 18, 1.E+01, 1.E+02, ..., 1.E+04 in the vertical-axis scale represent $1.0\times10$, $1.0\times10^2$, ..., $1.0\times10^4$, respectively. This graph represents measurement results by SIMS (Secondary Ion Mass Spectrometry) with use of TEG (Test Element Group), where the horizontal axis represents depth (nm) and the vertical axis represents relative secondary ion intensity (counts). As shown in FIG. 18, a convex-shaped chlorine concentration distribution is formed at the S1 position. As an example, the first chlorine concentration peak P10 is positioned at an interface-vicinal depth of about 10 nm from the interface S1 toward the GaN layer 201 side, and the second chlorine concentration peak P20 is positioned at a depth of about 95 nm from the interface S1 toward the GaN layer 201 side. In the example shown in FIG. 18, the chlorine concentration of the first chlorine concentration peak P10 was $1.6\times10^{17}$ cm$^{-3}$ and the chlorine concentration of the second chlorine concentration peak P20 was $8.4\times10^{16}$ cm$^{-3}$.

In addition, a chlorine concentration distribution in the depthwise direction over a range from the drain electrode 12 side to the GaN layer 201 side across the interface S2 between the drain electrode 12 and the undoped GaN layer 201 was the same as in the graph of FIG. 18.

Figure 19:
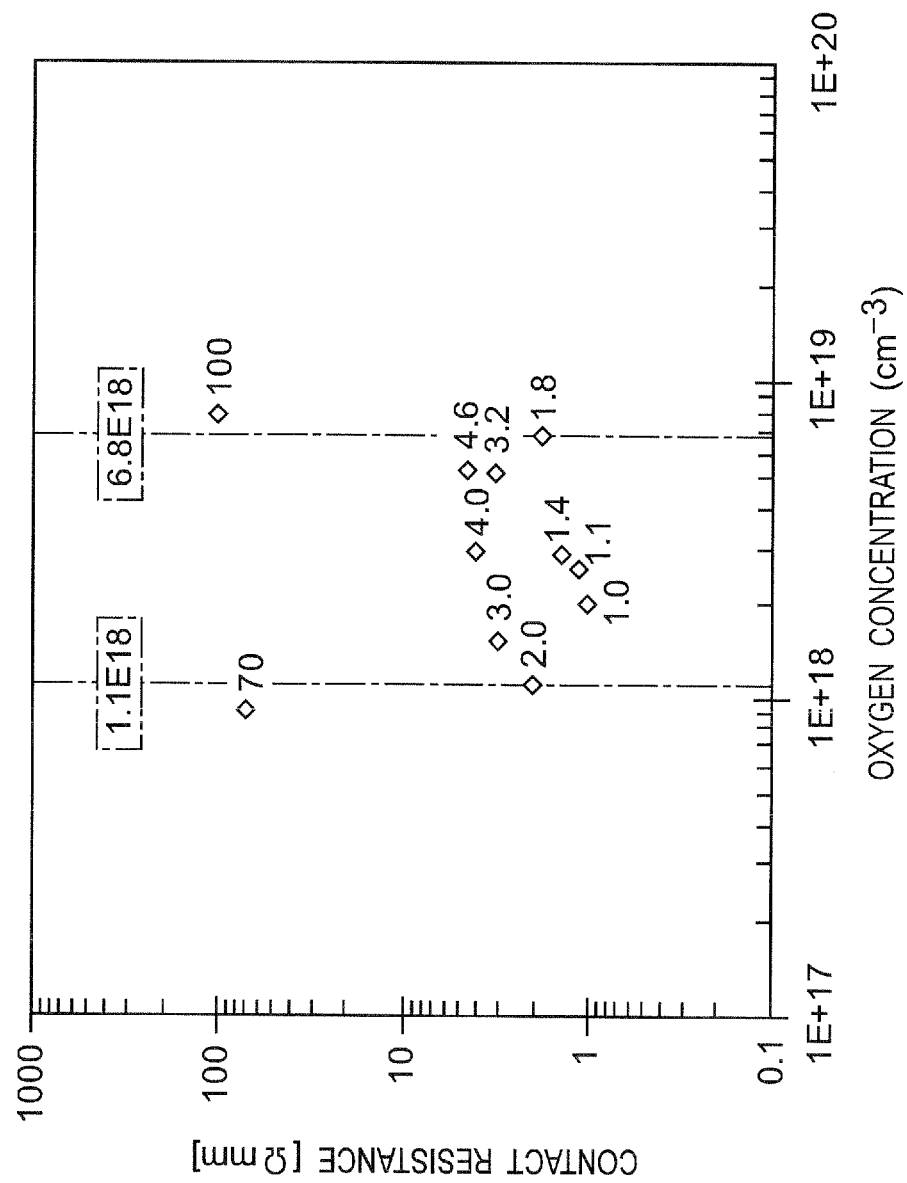
FIG. 19 is a graph showing a relationship between the oxygen concentration of an oxygen concentration peak in vicinity of the interface between the ohmic electrode and the GaN layer and the contact resistance of the ohmic electrode.

Next, FIG. 19 shows a relationship between the oxygen concentration (cm$^{-3}$) of the first oxygen concentration peak P1 and the contact resistance (Ωmm) between the 2DEG layer 203 of the nitride semiconductor multilayer body 220 and the source electrode 11 as well as the drain electrode 12. In FIG. 19, E+17, E+18, E+19, E+20 in the horizontal-axis scale represent $\times10^{17}$, $\times10^{18}$, $\times10^{19}$, $\times10^{20}$, respectively. In FIG. 19, numerical values described beside individual plots of rhombus mark (◆) represent contact resistances (Ωmm) for the individual plots.

As can be understood from FIG. 19, setting the oxygen concentration (cm$^{-3}$) of the first oxygen concentration peak P1 to within the range of $1.1\times10^{18}$ cm$^{-3}$ to $6.8\times10^{18}$ cm$^{-3}$ makes it possible to reduce the contact resistance remarkably as compared with cases where the oxygen concentration of the first oxygen concentration peak P1 is out of the above-mentioned range. As can be understood from FIG. 19, oxygen concentrations $1.1\times10^{18}$ cm$^{-3}$ and $6.8\times10^{18}$ cm$^{-3}$ of the first oxygen concentration peak P1 have a critical significance that the contact resistance abruptly changes to extents as large as 20- to 30-fold multiples across borderlines of those values.

In FIG. 19, the samples of individual plots are such that the chlorine concentration of the first chloride concentration peak is within a range of $5.0\times10^{16}$ (cm$^{-3}$) to $9.6\times10^{17}$ (cm$^{-3}$).

Figure 20:
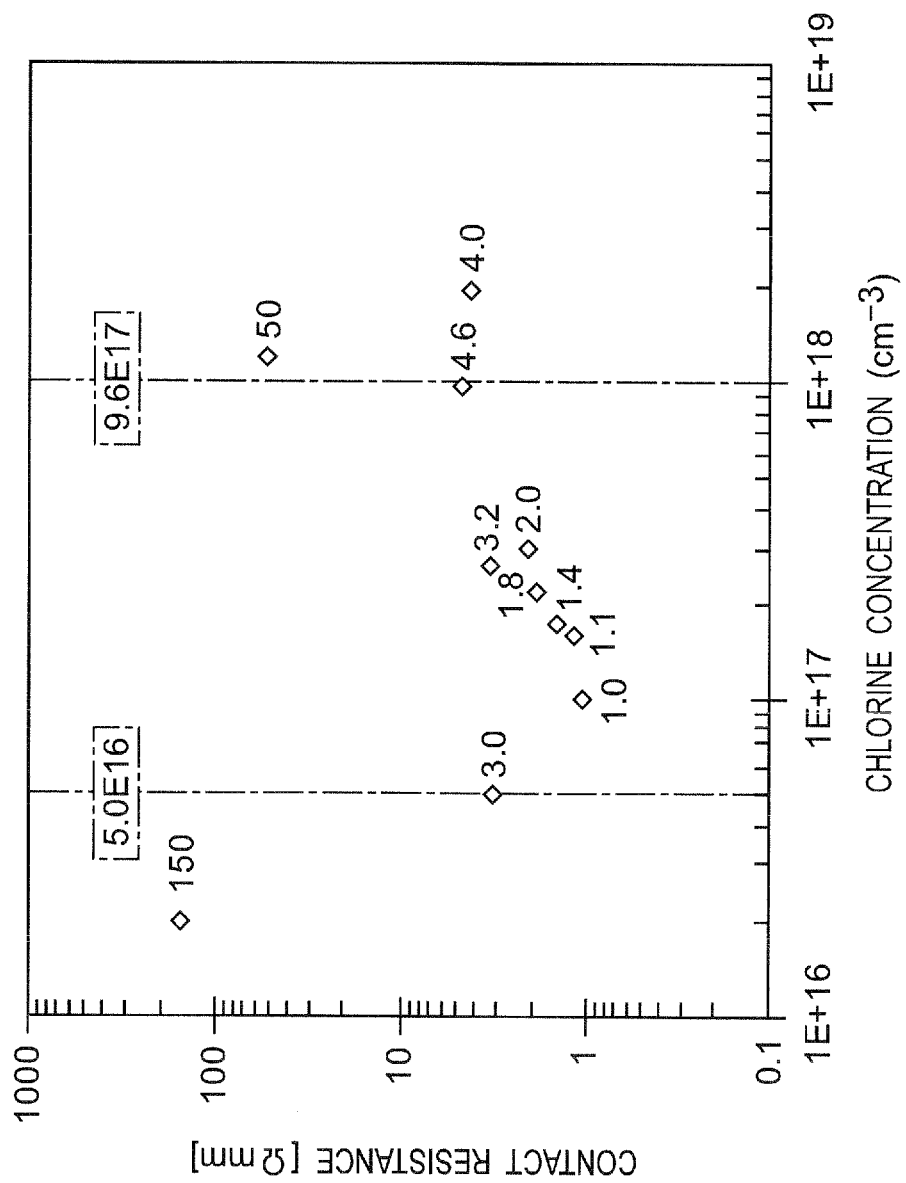
FIG. 20 is a graph showing a relationship between the chlorine concentration of a chlorine concentration peak in vicinity of the interface between the ohmic electrode and the GaN layer and the contact resistance of the ohmic electrode.

Next, FIG. 20 shows a relationship between the chlorine concentration (cm$^{-3}$) of the first chlorine concentration peak P10 and the contact resistance (Ωmm) between the 2DEG layer 203 of the nitride semiconductor multilayer body 220 and the source electrode 11, the drain electrode 12. In FIG. 20, E+16, E+17, E+18, E+19 in the horizontal-axis scale represent $\times10^{16}$, $\times10^{f}$, $\times10^{18}$, $\times10^{19}$, respectively. In FIG. 20, numerical values described beside individual plots of rhombus mark (◆) represent contact resistances (Ωmm) for the individual plots.

As can be understood from FIG. 20, setting the chlorine concentration (cm$^{-3}$) of the first chlorine concentration peak P10 to within the range of $5.0\times10^{16}$ cm$^{-3}$ to $9.6\times10^{17}$ cm$^{-3}$ makes it possible to reduce the contact resistance remarkably as compared with cases where the chlorine concentration of the first chlorine concentration peak P10 is out of the above-mentioned range. As can be understood from FIG. 20, chlorine concentrations $5.0\times10^{16}$ cm$^{-3}$ and $9.6\times10^{17}$ cm$^{-3}$ of the first chlorine concentration peak P10 have a critical significance that the contact resistance abruptly decreases to extents as large as 10- to 50-fold multiples on borders of those values.

In FIG. 20, the samples of individual plots are such that the oxygen concentration of the first oxygen concentration peak is within a range of $1.1\times10^{18}$ (cm$^{-3}$) to $6.8\times10^{18}$ (cm$^{-3}$).

Figure 21:
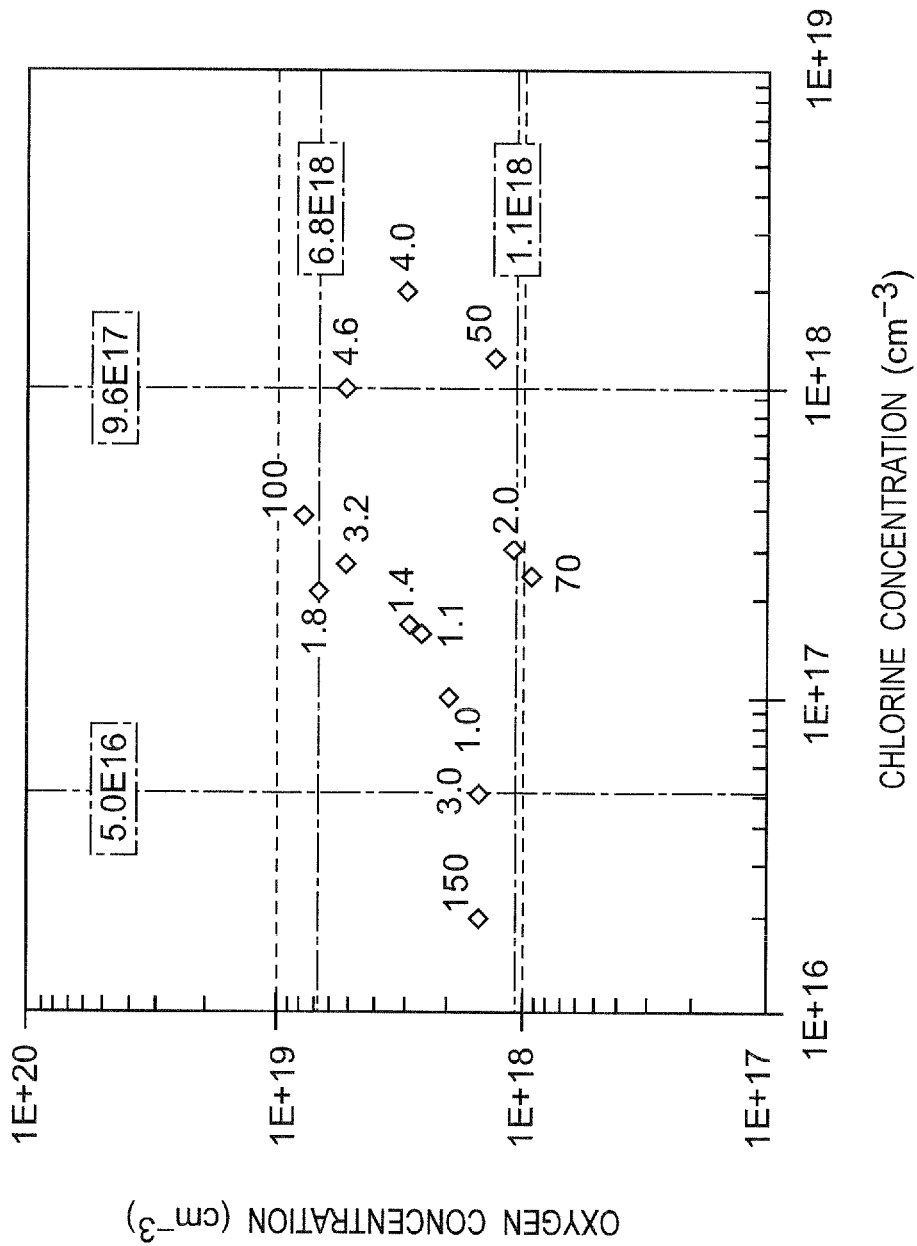
FIG. 21 is a graph showing a relationship between the oxygen concentration of the oxygen concentration peak as well as the chlorine concentration of the chlorine concentration peak and the contact resistance of the ohmic electrode.

Next, FIG. 21 shows a relationship among the oxygen concentration (cm$^{-3}$) of the first oxygen concentration peak P1 as well as the first chlorine concentration peak P10 and the contact resistance (Ωmm). In FIG. 21, the vertical axis represents oxygen concentration (cm$^{-3}$) of the first oxygen concentration peak P1, the horizontal axis represents chlorine concentration (cm$^{-3}$) of the first chlorine concentration peak P10, and numerical values described beside individual plots of rhombus mark (◆) represent contact resistances (Ωmm) for the individual plots. In FIG. 21, E+16, E+17, E+18, E+19 in the horizontal-axis scale represent $\times10^{16}$, $\times10^{17}$, $\times10^{18}$, $\times10^{19}$, respectively while E+17, E+18, E+19, E+20 in the vertical-axis scale represent $\times10^{17}$, $\times10^{18}$, $\times10^{19}$, $\times10^{20}$, respectively.

As can be understood from FIG. 21, since the oxygen concentration of the first oxygen concentration peak P1 is within the range of $1.1\times10^{18}$ cm$^{-3}$ to $6.8\times10^{18}$ cm$^{-3}$ and the chlorine concentration of the first chlorine concentration peak P10 is within the range of $5.0\times10^{16}$ cm$^{-3}$ to $9.6\times10^{17}$ cm$^{-3}$, the contact resistance can be reduced remarkably as compared with cases where the oxygen concentration of the first oxygen concentration peak P1 is out of the above-mentioned range or where the chlorine concentration of the first chlorine concentration peak P10 is out of the above-mentioned range. As can be understood from FIG. 21, with satisfaction of the conditions that the oxygen concentration of the first oxygen concentration peak P1 is within the range of $1.1\times10^{18}$ cm$^{-3}$ to $6.8\times10^{18}$ cm$^{-3}$ and that the chlorine concentration of the first chlorine concentration peak P10 is within the range of $5.0\times10^{16}$ cm$^{-3}$ to $9.6\times10^{17}$ cm$^{-3}$, the contact resistance abruptly decreases to extents as large as 10- to 50-fold multiples on the border of those oxygen concentrations $1.1\times10^{18}$ cm$^{-3}$ and $6.8\times10^{18}$ cm$^{-3}$ and chlorine concentrations $5.0\times10^{16}$ cm$^{-3}$ and $9.6\times10^{17}$ cm$^{-3}$, as compared with cases where the above conditions are not satisfied. Thus, those oxygen concentrations $1.1\times10^{18}$ cm$^{-3}$ and $6.8\times10^{18}$ cm$^{-3}$ and chlorine concentrations $5.0\times10^{16}$ cm$^{-3}$ and $9.6\times10^{17}$ cm$^{-3}$, which provide the above conditions, are of remarkable, critical significance.

In the above second embodiment, as an example, by the setting of the oxygen concentration of the first oxygen concentration peak being $2.6\times10^{18}$ cm$^{-3}$ and the chlorine concentration of the first chlorine concentration peak being $1.6\times10^{17}$ cm$^{-3}$, the contact resistance between the ohmic electrodes (source electrode 11, drain electrode 12) and the GaN layer 201 was able to be set to 1.1 Ωmm.

In contrast to this, with the oxygen concentration of the first oxygen concentration peak being below $1.1\times10^{18}$ cm$^{-3}$, the contact resistance abruptly increases to 70 Ωmm. This could be attributed to insufficient activation of oxygen, which is a reaction on the GaN layer 201 side necessary for ohmic contact formation. On the other hand, with the oxygen concentration of the first oxygen concentration peak higher than $6.8\times10^{18}$ cm$^{-3}$, the contact resistance abruptly increases to 100 Ωmm. This could be attributed to the reason that with an excessively high oxygen concentration of the first oxygen concentration peak P1, even though the chlorine concentration is low, excess oxygen reacts with Ti so as to block enough fulfillment of the N pulling-out reaction from GaN by Ti, which is a reaction on the GaN layer 201 side necessary for ohmic contact formation.

Also, there is a plot that the contact resistance abruptly increased to 50 Ωmm with the chlorine concentration of the first chlorine concentration peak P10 higher than $9.6\times10^{17}$ cm$^{-3}$. This could be attributed to the reason that with an excessively high chlorine concentration of the second chlorine concentration peak P20, even though the oxygen concentration is within a specified range ($1.1 \times 10^{18}$ cm$^{-3}$ to $6.8 \times 10^{18}$ cm$^{-3}$), excess chlorine reacts with Ga or Ti so as to inhibit the N pulling-out reaction from GaN by Ti as well as the activation of oxygen, which are reactions on the GaN layer 201 side necessary for ohmic contact formation.

According to this second embodiment, the oxygen concentration of the first oxygen concentration peak P1 is within the range of $1.1 \times 10^{18}$ cm$^{-3}$ to $6.8 \times 10^{18}$ cm$^{-3}$, and the chlorine concentration of the first chlorine concentration peak P10 is within the range of $5.0 \times 10^{16}$ cm$^{-3}$ to $9.6 \times 10^{17}$ cm$^{-3}$. As a result of this, it can be considered that the activation of oxygen and the N pulling-out reaction from GaN on the GaN layer 201 side necessary for ohmic contact formation can be accelerated so that ohmic contacts of remarkably low resistance can be formed, as compared with cases where the oxygen concentration of the first oxygen concentration peak P1 is out of the above-mentioned range or where the chlorine concentration of the first chlorine concentration peak P10 is out of the above-mentioned range.

In addition, according to the manufacturing method for the nitride semiconductor device of the second embodiment, the recesses 106, 109 are formed by removing the insulating film 130, the AlGaN layer 302 and the GaN layer 301 by dry etching. Alternatively, the recesses 106, 109 may also be formed by removing the insulating film 130 by wet etching and thereafter removing the AlGaN layer 302 and the GaN layer 301 by dry etching.

Also, according to the manufacturing method for the nitride semiconductor device of the second embodiment, layers of Ti/Al/TiN are stacked to provide ohmic electrodes. However, without being limited to this, TiN may be omitted, and after layers of Ti/Al are stacked, layers of Au, Ag, Pt or the like may be stacked thereon.

Also, the second embodiment has been described on a nitride semiconductor device using a Si substrate. However, without being limited to the Si substrate, it is also allowable to use a sapphire substrate or SiC substrate, where nitride semiconductor layers may be grown on the sapphire substrate or SiC substrate, or a nitride semiconductor layer may be grown on a substrate formed from a nitride semiconductor such as growing an AlGaN layer on a GaN substrate. Furthermore, a buffer layer may be formed between the substrate and the nitride semiconductor layer, or a hetero-improvement layer may be formed between the first nitride semiconductor layer and the second nitride semiconductor layer of the nitride semiconductor multilayer body.

Also, the second embodiment has been described on an HFET of a recess structure that the ohmic electrode reaches the GaN layer. However, the invention may also be applied to HFETs in which ohmic electrodes serving as a source electrode and a drain electrode are formed on an undoped AlGaN layer without forming any recess. Further, the nitride semiconductor device of the invention is not limited to HFETs using 2DEG and may be applied also to field effect transistors of other structures, in which case also similar effects can be obtained.

The second embodiment has been described on an HFET of the normally-ON type. Instead, the invention may also be applied to nitride semiconductor devices of the normally-OFF type. Further, without being limited to Schottky electrodes, the invention may also be applied to field effect transistors of the insulated-gate structure. Further, without being limited to field effect transistors, the invention may also be applied to ohmic electrodes of the Schottky diode.

The nitride semiconductor for the nitride semiconductor device of this invention needs only to be those expressed by $Al_x In_y Ga_{1-x-y} N$ ($x \geq 0$, $y \geq 0$, $0 \leq x+y \leq 1$).

Although specific embodiments of the present invention have been described hereinabove, yet the invention is not limited to the above embodiments and may be carried out as they are changed and modified in various ways within the scope of the invention.

REFERENCE SIGNS LIST 1, 101, 201, 301 GaN layer
2, 102, 202, 302 AlGaN layer
3, 103, 203, 303 2DEG layer
10 Si substrate
11 source electrode
12 drain electrode
13 gate electrode
15 AlGaN buffer layer
20, 120, 220, 320 nitride semiconductor multilayer body
30, 130 insulating film
40 interlayer insulating film
41 via hole
42 drain electrode pad
106, 109 recess
111, 112 ohmic electrode
P1 first oxygen concentration peak
P2 second oxygen concentration peak
P10, P11 first chlorine concentration peak
P20, P22 second chloride concentration peak
S1, S2 interface

The invention claimed is:

1. A nitride semiconductor device comprising:
a substrate;
a nitride semiconductor multilayer body formed on the substrate and having a heterointerface; and
ohmic electrodes which are made from a TiAl material and at least part of which are formed on the nitride semiconductor multilayer body or in the nitride semiconductor multilayer body, wherein
the nitride semiconductor multilayer body includes:
a first nitride semiconductor layer formed on the substrate; and
a second nitride semiconductor layer formed on the first nitride semiconductor layer to make up a heterointerface in combination with the first nitride semiconductor layer, and wherein
a chlorine concentration distribution in a depthwise direction over a range from the ohmic electrodes formed from the TiAl material to the nitride semiconductor multilayer body has:
a first chloride concentration peak at a position in vicinity of an interface between the ohmic electrodes and the nitride semiconductor multilayer body and in a substrate side region from the interface; and
a second chloride concentration peak at a position deeper than the first chloride concentration peak, and wherein
the chlorine concentration of the second chlorine concentration peak is
within a range of $3 \times 10^{16}$ cm$^{-3}$ to $1.3 \times 10^{17}$ cm$^{-3}$.

2. The nitride semiconductor device as claimed in claim 1, wherein
the position of the second chlorine concentration peak is at a depth within a range of 60 nm to 100 nm from the interface.

3. The nitride semiconductor device as claimed in claim 2, wherein the nitride semiconductor multilayer body includes recesses which extend through the second nitride semiconductor layer and reach a two-dimensional electron gas layer in vicinity of the heterointerface, and wherein at least part of the ohmic electrodes are buried in the recesses.

4. The nitride semiconductor device as claimed in claim 1, wherein the nitride semiconductor multilayer body includes recesses which extend through the second nitride semiconductor layer and reach a two-dimensional electron gas layer in vicinity of the heterointerface, and wherein at least part of the ohmic electrodes are buried in the recesses.

5. A nitride semiconductor device comprising:

a substrate;

a nitride semiconductor multilayer body formed on the substrate and having a heterointerface; and ohmic electrodes which are made from a TiAl material and at least part of which are formed in the nitride semiconductor multilayer body, wherein the nitride semiconductor multilayer body includes:

a first nitride semiconductor layer formed on the substrate; and a second nitride semiconductor layer formed on the first nitride semiconductor layer to make up a heterointerface in combination with the first nitride semiconductor layer, and wherein an oxygen concentration distribution in a depthwise direction over a range from the ohmic electrodes formed from the TiAl material to the nitride semiconductor multilayer body has an oxygen concentration peak at a position in vicinity of an interface between the ohmic electrodes and the nitride semiconductor multilayer body and in a substrate side region from the interface, where the oxygen concentration of the oxygen concentration peak is within a range of $1.1 \times 10^{18}$ $cm^{-3}$ to $6.8 \times 10^{18}$ $cm^{-3}$, and wherein a chlorine concentration distribution in a depthwise direction over a range from the ohmic electrodes formed from the TiAl material to the nitride semiconductor multilayer body has a chlorine concentration peak at a position in vicinity of the interface between the ohmic electrodes and the nitride semiconductor multilayer body and in a substrate side region from the interface, where the chlorine concentration of the chlorine concentration peak is within a range of $5.0 \times 10^{16}$ $cm^{-3}$ to $9.6 \times 10^{17}$ $cm^{-3}$.

6. The nitride semiconductor device as claimed in claim 5, wherein the nitride semiconductor multilayer body includes recesses which extend through the second nitride semiconductor layer and reach a two-dimensional electron gas layer in vicinity of the heterointerface, and wherein at least part of the ohmic electrodes are buried in the recesses.

* * * * *